United States Patent
Iwamatsu et al.

(10) Patent No.: US 7,453,135 B2
(45) Date of Patent: Nov. 18, 2008

(54) SEMICONDUCTOR DEVICE AND METHOD OF MANUFACTURING THE SAME

(75) Inventors: Toshiaki Iwamatsu, Tokyo (JP);
Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 130 days.

(21) Appl. No.: 11/617,936

(22) Filed: Dec. 29, 2006

(65) Prior Publication Data

US 2007/0105329 A1    May 10, 2007

Related U.S. Application Data

(62) Division of application No. 11/002,142, filed on Dec. 3, 2004, now Pat. No. 7,173,319.

(30) Foreign Application Priority Data

Dec. 19, 2003 (JP) ............... 2003-422762

(51) Int. Cl.
*H01L 29/93* (2006.01)
(52) U.S. Cl. ............... 257/506; 257/510; 257/E27.112; 257/E29.345
(58) Field of Classification Search ............... 257/347, 257/506, 509, 510, E27.112, E29.345, E27.016
See application file for complete search history.

(56) References Cited

U.S. PATENT DOCUMENTS

| 6,452,249 B1 * | 9/2002 | Maeda et al. ............... 257/531 |
| 6,635,550 B2 | 10/2003 | Houston |
| 6,833,602 B1 | 12/2004 | Mehta |
| 2002/0036335 A1 | 3/2002 | Minami |
| 2002/0072161 A1 * | 6/2002 | Maeda ............... 438/197 |
| 2002/0171120 A1 * | 11/2002 | Maeda et al. ............... 257/531 |
| 2002/0190349 A1 * | 12/2002 | Maeda et al. ............... 257/531 |
| 2003/0008472 A1 | 1/2003 | Yoshimura et al. |
| 2005/0133864 A1 * | 6/2005 | Iwamatsu et al. ............ 257/347 |
| 2006/0270126 A1 | 11/2006 | Iwamatsu et al. |
| 2007/0105329 A1 | 5/2007 | Iwamatsu et al. |

FOREIGN PATENT DOCUMENTS

| CN | 1329367 A | 1/2002 |
| JP | 9-289324 | 11/1997 |
| JP | 2000-21902 A | 1/2000 |
| JP | 2002-110908 | 4/2002 |

OTHER PUBLICATIONS

U.S. Appl. No. 11/617,936, filed Dec. 29, 2006, Iwamatsu et al.
Yuuichi Hirano, et al., "Impact of 0.10 μm SOI CMOS with Body-Tied Hybrid Trench Isolation Structure to Break Trough the Scaling Crisis of Silicon Technology", IEDM, 2000, pp. 1-4.

(Continued)

*Primary Examiner*—Walter L Lindsay, Jr.
(74) *Attorney, Agent, or Firm*—Oblon, Spivak, McClelland, Maier & Neustadt, P.C.

(57) ABSTRACT

Plural trench isolation films are provided with portions of an SOI layer interposed therebetween in a surface of the SOI layer in a resistor region (RR) where a spiral inductor (SI) is to be provided. Resistive element are formed on the trench isolation films, respectively. Each of the trench isolation films includes a central portion which passes through the SOI layer and reaches a buried oxide film to include a full-trench isolation structure, and opposite side portions each of which passes through only a portion of the SOI layer and is located on the SOI layer to include a partial-trench isolation structure. Thus, each of the trench isolation films includes a hybrid-trench isolation structure.

10 Claims, 21 Drawing Sheets

OTHER PUBLICATIONS

Toshiaki Iwamatsu, et al., "Low-Noise and High-Frequency 0.10 μm body-tied SOI-CMOS Technology with High-Resistivity Substrate for Low-Power 10Gbps Netwok LSI", SSDM, 2003, pp. 1-2.

U.S. Appl. No. 11/873,907, filed Oct. 7, 2007, Iwamatsu et al.

* cited by examiner

F I G . 1
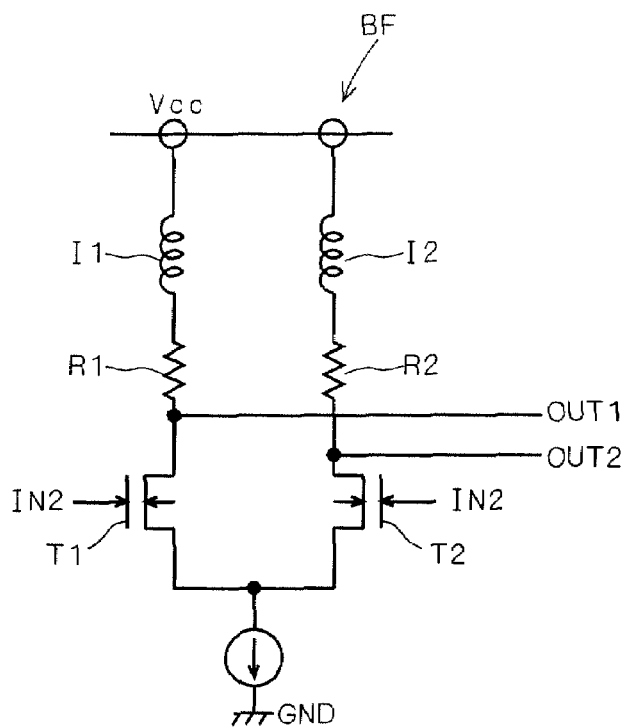
F I G . 2
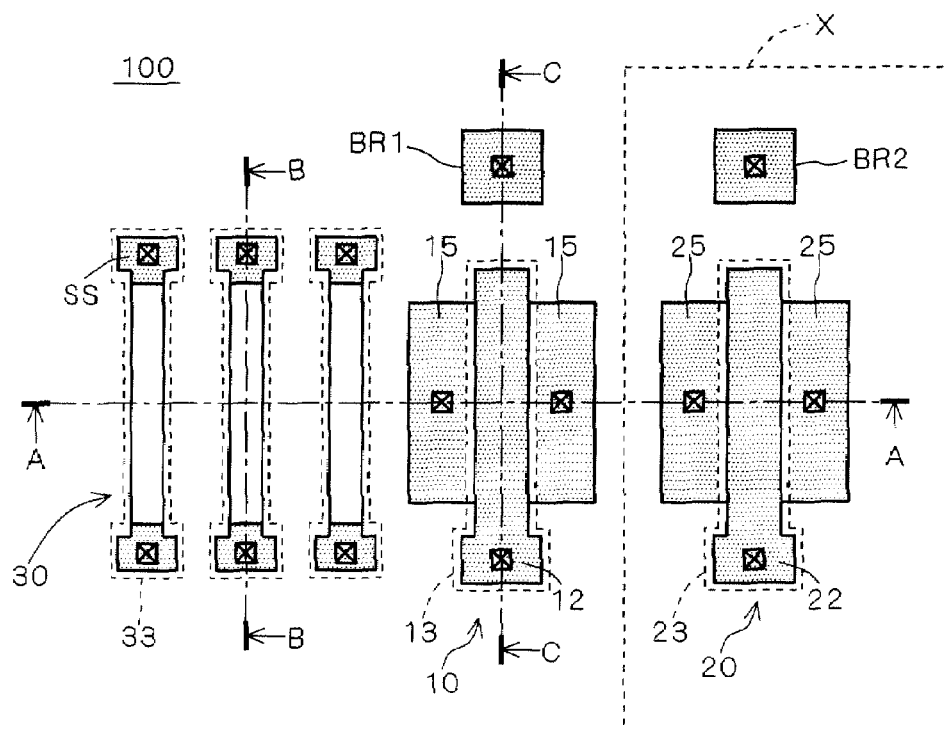

F I G . 9
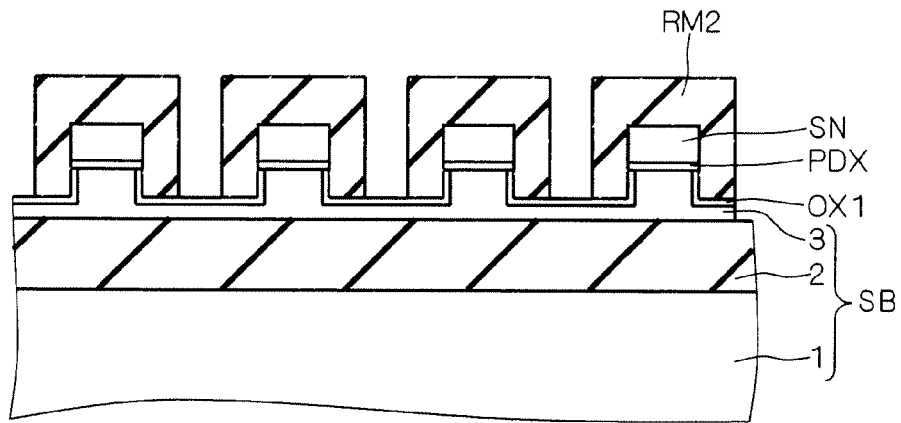
F I G . 1 0
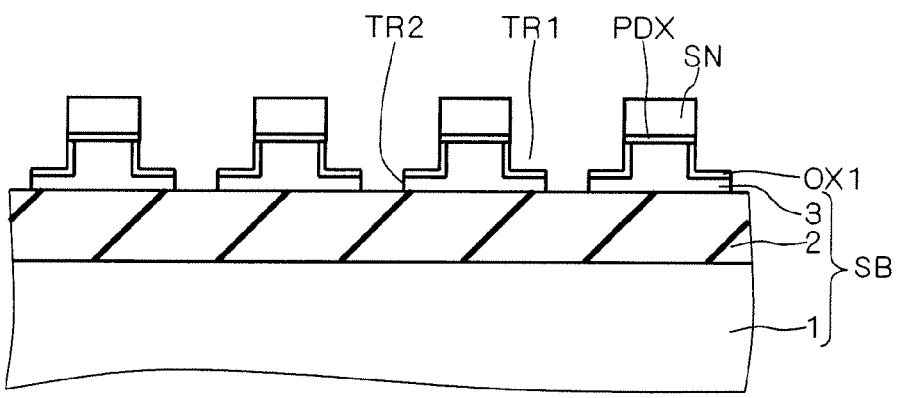
F I G . 1 1
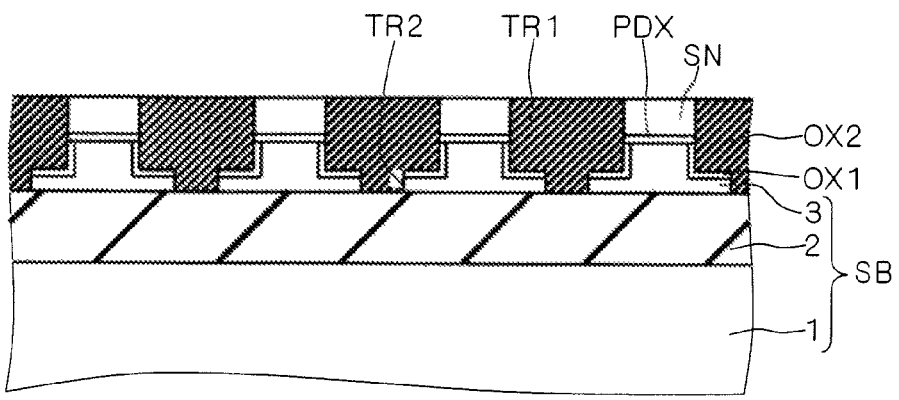

F I G . 3 2
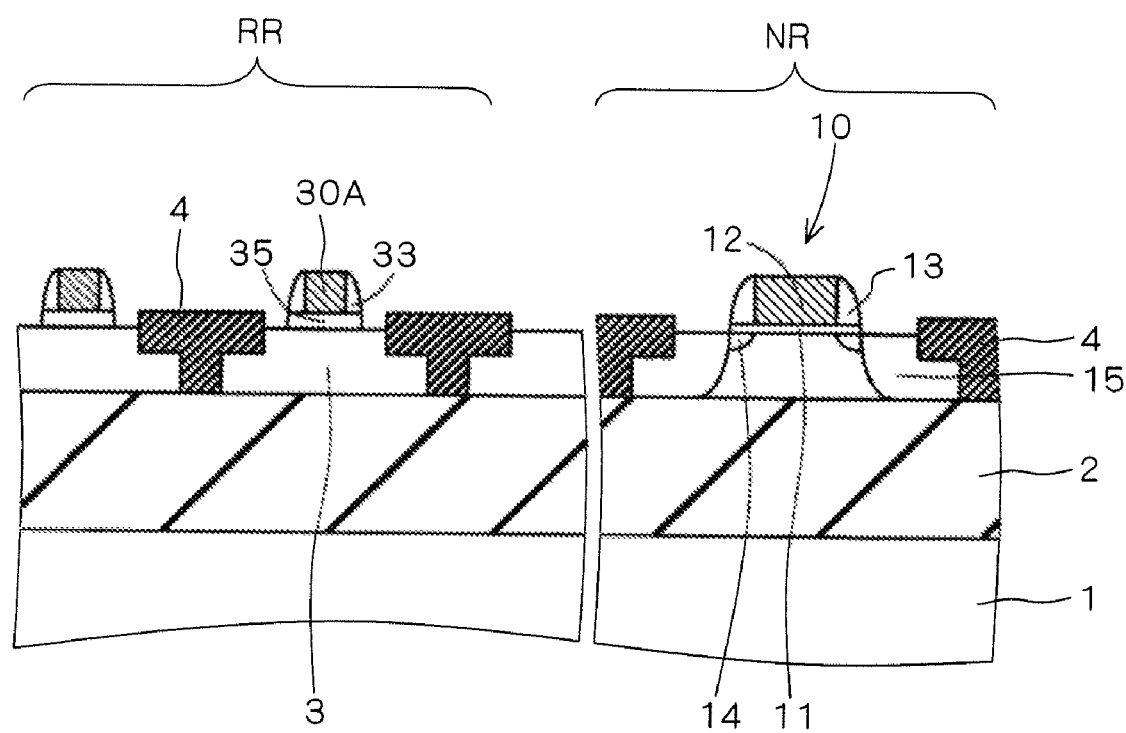

SEMICONDUCTOR DEVICE AND METHOD OF MANUFACTURING THE SAME

CROSS-REFERENCE TO RELATED APPLICATIONS

This application is a Divisional Application of, and claims the benefit of priority under 35 U.S.C. § 120 from, U.S. application Ser. No. 11/002,142, filed Dec. 3, 2004, now U.S. Pat. No. 7,173,319 and claims the benefit of priority under 35 U.S.C. § 119 from Japanese Patent Application No. 2003-422762, filed Dec. 19, 2003. The entire contents of the above are incorporated herein by reference.

BACKGROUND OF THE INVENTION

1. Field of the Invention

The present invention relates to a semiconductor device and a method of manufacturing the same, and more particularly to a semiconductor device including an inductor and a method of manufacturing the same.

2. Description of the Background Art

A semiconductor device formed on an silicon-on-insulator (SOI) substrate which includes a buried oxide film and an SOI layer deposited on a silicon substrate (such semiconductor device will be hereinafter referred to as an "SOI device") is characterized by a lower parasitic capacitance, a high-speed and reliable operation, and lower power consumption, and is used in a portable equipment or the like.

One example of an SOI device is an SOI device with a "full-trench isolation (FTI) structure". In SOI device with the FTI structure, a trench reaching a buried oxide film is formed in a surface of an SOI layer and is filled with an insulator (which will hereinafter be also referred to as a "full-trench isolation film"), to electrically separate elements from each other. In the SOI device with the FTI structure, however, carriers (holes in an NMOS device) generated due to impact ionization are most likely to be accumulated in a channel region (where channel is to be formed). As such, the SOI device with the FTI structure has suffered from various problems associated with floating body effects. For example, a kink occurs, a breakdown voltage is reduced, or a delay time becomes frequency-dependent because of unstable potential of the channel region.

To overcome the foregoing problems, a "partial-trench isolation (PTI) structure" has been invented. The PTI structure is formed by forming a trench in a surface of an SOI layer while leaving a portion with a predetermined thickness of the SOI layer un-removed between a bottom of the trench and a buried oxide film, and filling an insulator (trench isolation film) into the trench.

The PTI structure allows carriers to move through a well region under the trench isolation film. Accordingly, accumulation of the carriers in a channel region can be prevented. Also, the potential of the channel region can be fixed because of existence of the well region, so that the above-cited various problems associated with floating body effects can be avoided.

In the meantime, in forming a high-frequency analog circuit or the like, an inductor, a capacitor, a resistor, and the like are employed as passive elements, in addition to a transistor as an active element.

For example, Japanese Patent Application Laid-Open No. 9-289324 (which will hereinafter be referred to as "JP 9-289324") discloses forming a polysilicon resistor on a LOCOS oxide film (an oxide film formed by local oxide of silicon), at the fifth and sixth columns and FIG. 2(g).

When an SOI device with the PTI structure includes a spiral inductor, a full-trench isolation film is formed in an SOI layer in a region which is located under the inductor. Then, resistive elements are formed on the full-trench isolation film.

The spiral inductor has a cross section shaped like a rectangle having sides each with a length in a range between several tens of micrometers to several hundreds of micrometers. Thus, to form the full-trench isolation film under the spiral inductor means that the full-trench isolation film extends over a wide region corresponding to a footprint of the spiral inductor.

Then, to perform a chemical mechanical polishing (CMP) process for completing the full-trench isolation film in the above-described SOI device would cause the full-trench isolation film to be over-polished and removed in an amount larger than required. As a result, so-called dishing occurs. More specifically, a thickness of the full-trench isolation film decreases as a distance to a center thereof decreases. To form the resistive elements on the full-trench isolation film in which dishing is occurring causes undesired change in dimension or shape of some of the resistive elements which are located in the vicinity of an edge of the full-trench isolation film.

One possible solution to the foregoing undesired change is to avoid forming a resistive element in the vicinity of the edge of the full-trench isolation film. However, this solution requires increase in area of the full-trench isolation film in order to form the necessary number of resistive elements. As a result, a total area of the device is increased.

Also, if excessive dishing occurs in the CMP process, not only the isolation film and the SOI layer, but also an underlying buried oxide film, is probably polished. Further, a silicon substrate may possibly be polished.

A conventional solution for avoiding occurrence of dishing is to form plural dummy-element sites separately from one another in a region under the spiral inductor and its neighborhood, as disclosed by Japanese Patent Application Laid-Open No. **2002-110908 in the sixth column and FIGS. 3 and 4 (which will hereinafter be referred to as "JP 2002-110908"), for example.

As described above, the problem of occurrence of dishing must be faced with in forming a trench isolation film having a large area. In this regard, the structure disclosed by JP 2002-110908 which avoids occurrence of dishing by forming plural dummy-element sites separately from one another in a region where the trench isolation film is supposed to be formed, would not permit provision of the resistive elements in the corresponding region. Hence, the structure disclosed by JP2002-110908 is unsuitable for a high-frequency analog circuit or the like.

SUMMARY OF THE INVENTION

It is an object of the present invention to form an SOI device which prevents occurrence of dishing and provides for reduction of a parasitic capacitance of a resistive element, to thereby achieve high circuit performance.

According to a first aspect of the present invention, a semiconductor device includes an SOI substrate, plural first isolation films, and plural resistive elements. The SOI substrate includes a substrate serving as a base, a buried oxide film provided on the substrate, and an SOI layer provided on the buried oxide film. The plural first isolation films are provided in a main surface of the SOI layer in a first region defined on the SOI substrate, with a portion of the SOI layer interposed therebetween. The plural resistive elements are provided on the plural first isolation films in the first region, respectively.

At least a portion of each of the plural first isolation films passes through the SOI layer and reaches the buried oxide film to include a full-trench isolation structure.

In the above semiconductor device, the plural first isolation films are provided in the main surface of the SOI layer in the first region defined on the SOI substrate, with a portion of the SOI layer interposed therebetween. Accordingly, the semiconductor device does not include a single isolation film which extends over a wide area when the first region has an extensive area. As a result, occurrence of dishing which is likely to occur during formation of the isolation films can be prevented. Also, since the resistive elements are provided on the plural first isolation films in the first region, respectively, the first region can be effectively used. Hence, the structure of the above semiconductor device does not invite increase in area thereof, and thus is suitable for formation of a high-frequency analog circuit.

According to a second aspect of the preset invention, a semiconductor device includes an SOT substrate, plural first isolation films, and plural resistive elements. The SOI substrate includes a substrate serving as a base, a buried oxide film provided on the substrate, and an SOI layer provided on the buried oxide film. The plural first isolation films are provided in a main surface of the SOI layer in a first region defined on the SOI substrate, with portions of the SOI layer interposed therebetween. The plural resistive elements are provided via insulating films on the portions of the SOI layer interposed between the plural first isolation films, respectively. At least a portion of each of the plural first isolation films passes through the SOI layer and reaches the buried oxide film to include a full-trench isolation structure.

In the above semiconductor device, the plural first isolation films are provided in the main surface of the SOI layer in the first region defined on the SOI substrate, with the portions of the SOI layer interposed therebetween. Accordingly, the semiconductor device does not include a single isolation film which extends over a wide area when the first region has an extensive area. As a result, occurrence of dishing which is likely to occur during formation of the isolation films can be prevented. Also, since the resistive elements are provided via the insulating films on the portions of the SOI layer interposed between the plural first isolation films in the first region, respectively, the first region can be effectively used. Hence, the structure of the above semiconductor device does not invite increase in area thereof, and thus is suitable for formation of a high-frequency analog circuit.

A third aspect of the present invention is directed to a method of manufacturing a semiconductor device which includes: an SOI substrate including a substrate serving as a base, a buried oxide film provided on the substrate, and an SOI layer provided on the buried oxide film; plural isolation films provided in a main surface of the SOI layer in a first region defined on the SOI substrate, with portions of the SOI layer interposed therebetween; plural resistive elements provided on the plural isolation films in the first region or the portions of the SOI layer interposed between the plural first isolation films, respectively; and a MOS transistor provided in a second region different from the first region. The method includes the steps (a), (b), (c), and (d). The step (a) is to form the plural isolation films in the main surface of the SOI layer in the first region. The step (b) is to perform ion implantation of an impurity into the SOI layer in the second region, to determine a threshold voltage of the MOS transistor. The step (c) is to form a polysilicon layer which extends over the first and second regions after the step (b). The step (d) is to pattern the polysilicon layer over the first and second regions, to form the resistive elements and a gate electrode of the MOS transistor. The step (b) includes a step of covering the first region with a mask, to prevent the impurity from being implanted into the first region.

By the above manufacturing method, implantation of impurity into the SOI layer is prevented in the first region during formation of a semiconductor element. Accordingly, a resistance of the SOI layer can be kept high in the first region, and also, the SOT layer can be fully depleted in the first region, depending on a voltage. As a result, a parasitic capacitance of each of the resistive elements can be reduced, to thereby obtain a semiconductor device suitable for high-frequency operation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates a structure of a buffer circuit.

FIG. 2 is a plan view of a structure of a semiconductor device according to a preferred embodiment of the present invention.

FIG. 6 through 13 are sectional views for explaining a method of manufacturing a resistor region of the semiconductor device according to the preferred embodiment of the present invention.

FIG. 32 is a sectional view of a structure of a semiconductor device according to a fifth modification of the preferred embodiment of the present invention.

DESCRIPTION OF THE PREFERRED EMBODIMENTS

Example of High-Frequency Analog Circuit

Figure 3:
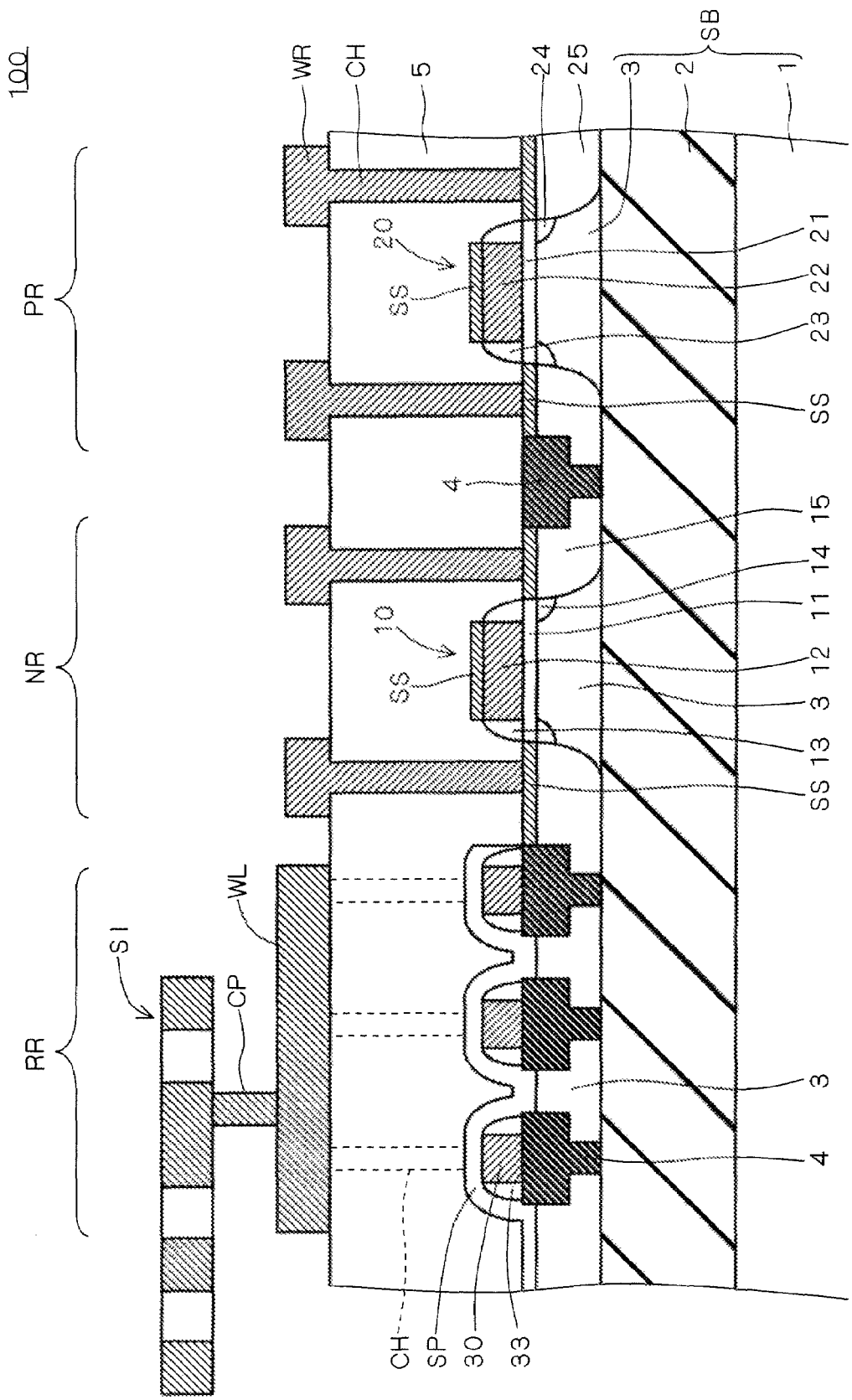
FIGS. 3, 4, and 5 are sectional views of the structure of the semiconductor device according to the preferred embodiment of the present invention.

FIG. 1 illustrates a structure of a current-operated buffer circuit BF as one example of a high-frequency analog circuit. The buffer circuit BF includes spiral inductors I1 and I2 connected in parallel with each other to a power supply VCC for driving, resistors R1 and R2 connected to the spiral inductors I1 and I2, respectively, N-channel transistors T1 and T2 including respective drains connected to the resistors R1 and R2, and a current source SC to which respective sources of the N-channel transistors T1 and T2 are connected in common.

In the buffer circuit BF including the foregoing structure, upon supply of complementary signals IN1 and IN2 to gates of the N-channel transistors T1 and T2, respectively, inverted complementary signals are output from respective output terminals OUT 1 and OUT 2 of the N-channel transistors T1 and T2.

A rising rate or a falling rate of the output signals depends on a resistance or a capacitance of the circuit. In order to attain a sharp rise or a sharp fall, it is effective to reduce a parasitic capacitance of each of the resistors R1 and R2. Also, since each of the resistor R1 and R2 includes plural resistive elements, to configure those plural resistive elements as designed is important to achieve improved circuit performance.

Preferred Embodiment

A. Structure of Device

A structure of an SOI device 100 will be described below, as a preferred embodiment of a semiconductor device according to the present invention. First, a structure of the SOI device 100 when viewed from above will be described with reference to FIG. 2 which is a plan view of the SOI device 100.

Referring to FIG. 2, an N-channel MOS transistor 10 and a P-channel MOS transistor 20 are formed adjacent to each other such that respective gate electrodes 12 and 22 are arranged along gate lengths thereof.

Also, a body-potential fixing region BR1 for fixing a potential is formed at some distance from one of edges of the gate electrode 12 of the MOS transistor 10, which are opposite to each other across a gate width of the gate electrode 12. Similarly, a body-potential fixing region BR2 for fixing a potential is formed at some distance from one of edges the gate electrode 22 of the MOS transistor 20, which are opposite to each other across a gate width of the gate electrode 22. A region where the MOS transistor 10 is formed and a region where the MOS transistor 20 is formed are electrically insulated from each other. Such insulation is indicated by dashed lines X in FIG. 2, for easy understanding.

Further, a region where resistive elements are formed is located on the left-hand side of the MOS transistor 10 in FIG. 2. Plural resistive elements 30 are formed in parallel. Each of the resistive elements 30 is elongated, and the resistive elements 30 are arranged along shorter lengths thereof.

Figure 4:
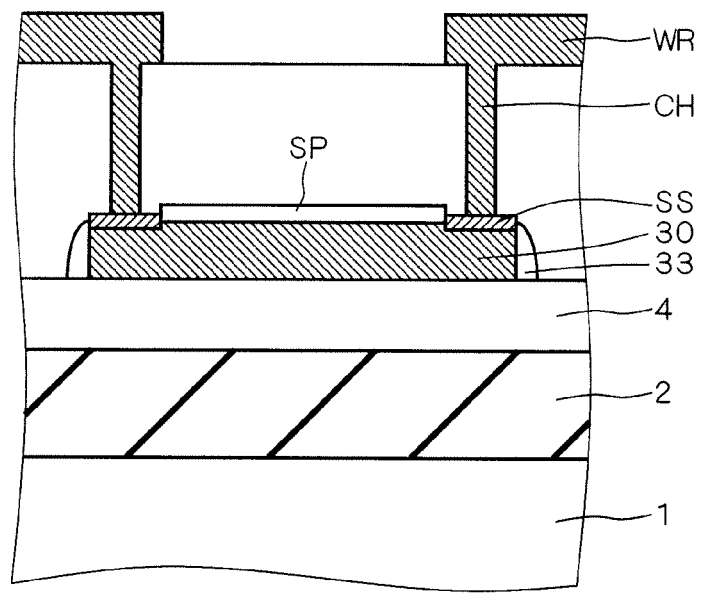
Figure 5:
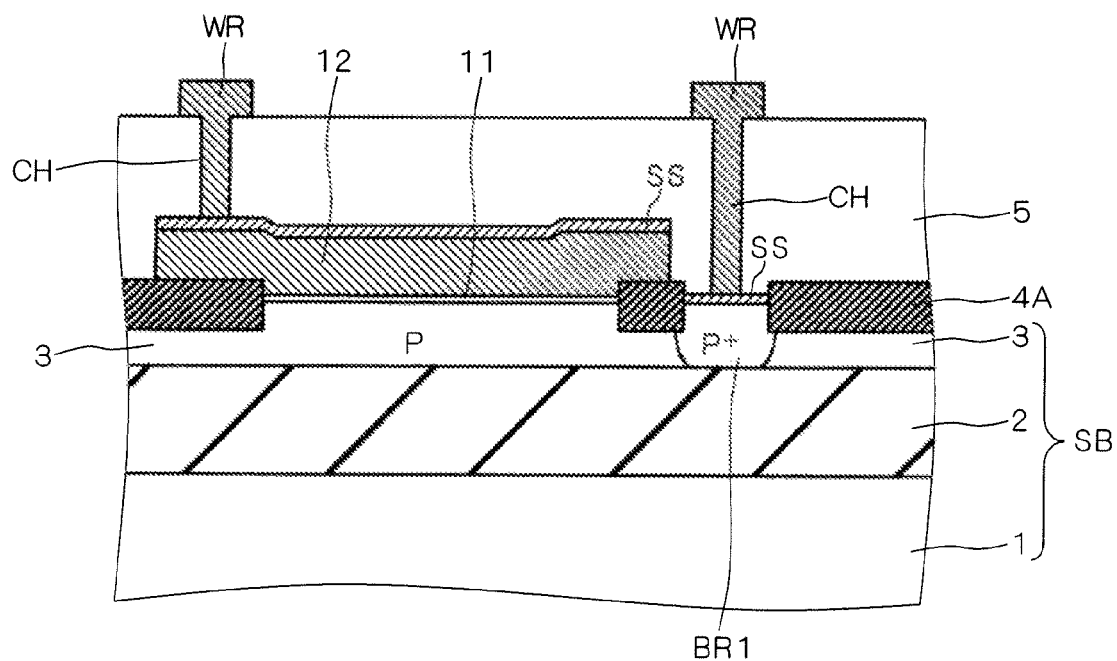

Next, a structure of the SOI device 100 in section will be described. FIG. 3 is a sectional view taken along a line A-A in FIG. 2, FIG. 4 is a sectional view taken along a line B-B in FIG. 2, and FIG. 5 is a sectional view taken along a line C-C in FIG. 2.

Referring to FIG. 3, the SOI device 100 is formed on an SOI substrate SB which includes a silicon substrate 1, a buried oxide film 2 formed on the silicon substrate 1, and an SOI layer 3 formed on the buried oxide film 2.

A space on and above the SOI substrate SB is divided into a resistor region RR (a first region) where the resistive elements 30 are formed and an element region (a second region). The element region includes an NMOS region NR where the N-channel MOS transistor 10 is formed and a PMOS region PR where the P-channel MOS transistor 20 is formed. It is noted that though FIGS. 2 and 3 illustrate one NMOS transistor 10, one PMOS transistor 20, and three resistive elements 30 for convenience in illustration, the numbers of those elements are not limited to the numbers illustrated in FIGS. 2 and 3. Also, though the resistive elements 30 are arranged in parallel with the gate electrodes 12 and 22 in the example illustrated in FIGS. 2 and 3, the present invention is not limited to that example. The resistive elements 30 may alternatively be formed such that an array of the resistive elements 30 is perpendicular to an array of the gate electrodes 12 and 22.

In the resistor region RR, plural trench isolation films 4 are formed in a surface of the SOI layer 3 under a spiral inductor SI, with portions of the SOI layer 3 interposed therebetween. The resistive elements 30 are formed on the plural trench isolation films 4, respectively. Further, a sidewall insulating film 33 is formed to cover each side face of the resistive elements 30.

Each of the trench isolation films 4 includes a central portion which passes through the SOI layer 3 and reaches the buried oxide film 2 to provide complete isolation, and opposite side portions each of which passes through only a portion of the SOI layer 3 and is located on the SOI layer 3 to provide partial isolation. As such, a section of each of the trench isolation films 4 is approximately T-shaped. In the present specification, a structure of the central portion which provides complete isolation is called a "full-trench isolation (FTI) structure", and a structure of each of the opposite side portions which provides partial isolation is called a "partial-trench isolation (PTI) structure". Further, a structure of each of the trench isolation films 4 which includes both the FTI structure and the PTI structure is called a "hybrid-trench isolation (HTI) structure".

It is additionally noted that the sectional shape of the hybrid-trench isolation structure is not limited to an approximate T. Any structure including both the full-trench isolation structure and the partial-trench isolation structure can be regarded as the hybrid-trench isolation structure, irrespective of its sectional shape.

Referring back to FIG. 3, a silicide protection film SP is formed to cover the plural resistive elements 30 and the portions of the SOI layer 3 interposed between the plural resistive elements 30. The silicide protection film SP, which includes an insulating film such as a silicon oxide film, is formed in a region where a silicide film must not be formed. More specifically, the silicide protection film SP covers respective central portions of the elongated resistive elements 30, while silicide films SS are formed on edge portions of each of the resistive elements 30, which edge portions are opposite to each other across a longer length of each of the resistive elements 30, as illustrated in FIG. 4. It is noted that hatched portions in FIG. 2 indicate locations of the silicide films SS.

The MOS transistor 10 includes a gate insulating film 11 selectively formed on the SOI layer 3, the gate electrode 12 formed on the gate insulating film 11, the silicide film SS formed on the gate electrode 12, and sidewall insulating films 13 covering respective side faces of the gate insulating film 11, the gate electrode 12, and the silicide film SS.

Further, source/drain layers 15 are formed in the surface of the SOI layer 3 on opposite sides of the sidewall insulating films 13 of the MOS transistor 10, and extension layers 14 shallower than the source/drain layers 15 are formed. Moreover, the silicide films SS are formed also on the source/drain layers 15.

The MOS transistor 20 includes a gate insulating film 21 selectively formed on the SOI layer 3, the gate electrode 22 formed on the gate insulating film 21, the silicide film SS formed on the gate electrode 22, and sidewall insulating films 23 covering respective side faces of the gate insulating film 21, the gate electrode 22, and the silicide film SS.

Further, source/drain layers 25 are formed in the surface of the SOI layer 3 on out sides of the sidewall insulating films 23, and extension layers 24 shallower than the source/drain layers 25 are formed. Moreover, the silicide films SS are formed also on the source/drain layers 25.

Each of the extension layers 14 and 24 is an impurity layer serving as a junction shallower than the source/drain layers. Each of the extension layer 14 and 24 is of the same conductivity type as that of the source/drain layers, and functions as a source/drain layer. As such, each of the extension layers 14 and 24 might have to be called a source/drain extension layer. However, in the present specification, the terms, "extension layer" will be used for simplicity.

The NMOS region NR and the PMOS region PR are electrically isolated from each other by the trench isolation film 4 with the hybrid-trench isolation structure.

An interlayer insulating film 5 including a silicon oxide film, for example, is formed so as to cover all regions on the SOI substrate SB, and the spiral inductor SI is formed above the interlayer insulating film 5.

Further, plural contact portions CH which pass through the interlayer insulating film 5 and connected to the silicide films SS on the source/drain layers 15 and 25, respectively, are formed. Each of the contact portions CH is connected to a wiring layer WR on the interlayer insulating film 5.

Further contact portions CH are formed to connect the resistive elements 30 and a wiring layer WL on the interlayer insulating film 5. The wiring layer WL is electrically connected to the spiral inductor SI via a contact portion CP.

It is additionally noted that though more interlayer insulating films are formed on the interlayer insulating film 5, such interlayer insulating films are not illustrated in FIG. 3 for purposes of simplification.

Referring to FIG. 5, in the NMOS regions NR where the MOS transistor 10 is formed, the body-potential fixing region BR1 and a portion of the SOI layer 3 located under the gate electrode 12 of the MOS transistor 10 are electrically connected to each other via SOI layer 3 located under a trench isolation film 4A which has the partial trench isolation structure. Further, also the body-potential fixing region BR2 and a portion of the SOI layer 3 located under the gate electrode 22 of the MOS transistor 20 in the PMOS regions PR are electrically connected to each other in the same manner as described above.

As a result, carriers can move between the MOS transistor 10 and the body-potential fixing region BR1 via the portion of the SOI layer 3 located under the trench isolation film 4A. Accordingly, accumulation of carriers in a channel region can be prevented, and the potential of the channel region can be fixed. Consequently, floating body effects can be suppressed.

Further, because of the hybrid-trench isolation structure of the trench isolation film 4 located between the NMOS region NR and the PMOS region PR as illustrated in FIG. 2, the NMOS region NR and the PMOS region PR can completely be electrically separated from each other, so that occurrence of latch-up phenomenon can be prevented.

Moreover, formation of the hybrid-trench isolation structure inevitably includes formation of the partial-trench isolation structure. As such, the partial-trench isolation structure can be obtained in the course of formation of the hybrid-trench isolation structure, which allows effective manufacture. As is made clear from the above description, the hybrid-trench isolation (HTI) structure is an ideal device structure.

B. Manufacturing Method

B-1. Manufacture of Trench Isolation Film

Below, a method of manufacturing the trench isolation films 4 will be described with reference to FIGS. 6 through 13 which illustrate steps for manufacturing the trench isolation films 4 in order of occurrence. It is noted that each of FIGS. 6 through 13 illustrates only the resistor region by way of example, and omits the element region.

Figure 6:
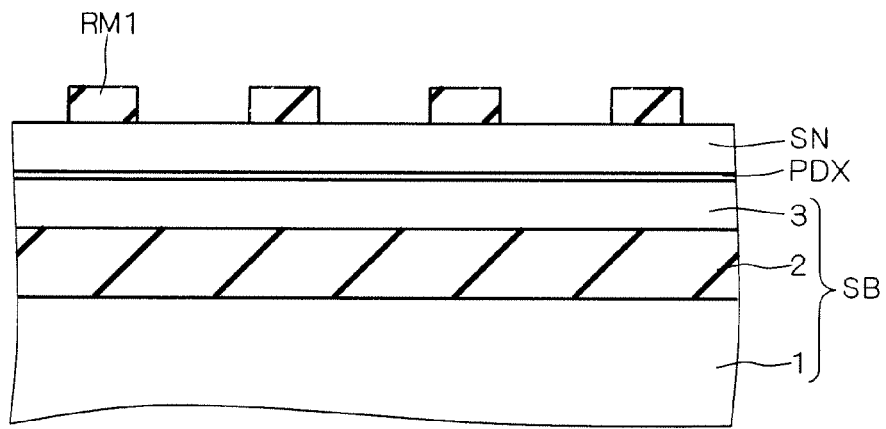

In the step illustrated in FIG. 6, the SOI substrate SB including the silicon substrate 1, the buried oxide film 2, and the SOI layer 3 is prepared. The SOI substrate SB can be formed using a SIMOX technique, a bonding technique, or the like. Generally, a thickness of the SOI layer 3 is in a range from 50 to 200 nm, and a thickness of the buried oxide film 2 is in a range from 100 to 400 nm. Additionally, an impurity concentration of the SOI layer 3 at this stage is lower than $1 \times 10^{16}/cm^3$.

Additionally, by employing a high resistivity substrate (a substrate having a resistivity of 1000Ω·cm or higher) as the silicon substrate 1, crosstalk between an analog circuit and a digital circuit can be suppressed. Also, performance (a quality factor) of a passive element such as the spiral inductor can be improved, to thereby achieve a structure suitable for a high-frequency analog circuit.

After the SOI substrate SB is prepared, a pad oxide film PDX with a thickness in a range from 5 to 30 nm is formed on the SOI layer 3 by thermal oxidation. Subsequently, a silicon nitride film SN with a thickness in a range from 100 to 200 nm is deposited on the pad oxide film PDX by a CVD process at a temperature in a range from 600 to 800° C.

Thereafter, a resist mask RM1 is formed on the silicon nitride film SN by patterning. The resist mask RM1 includes openings used for formation of trenches.

Figure 7:
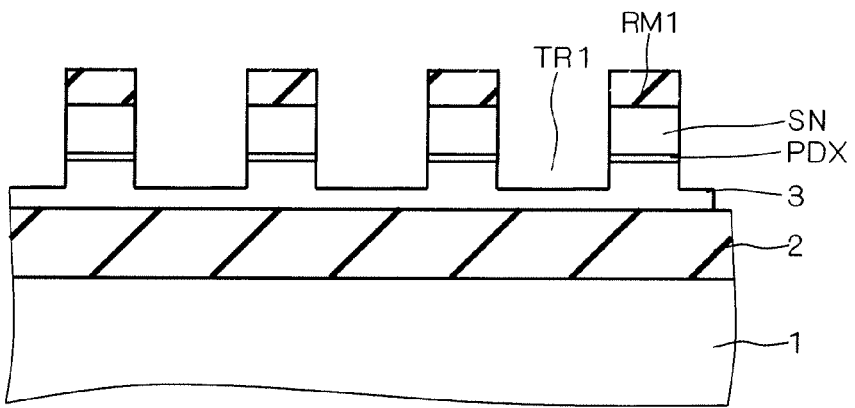

Next, in the step illustrated in FIG. 7, the silicon nitride film SN, the pad oxide film PDX, and the SOI layer 3 are subjected to etching using the resist mask RM1 as a mask, to be patterned. As a result, partial trenches TR1 are formed in the SOI layer 3. For the etching in this step, etching conditions are adjusted so as to leave a portion with a predetermined thickness of the SOI layer 3 un-removed under each of the partial trenches TRI. That is, the buried oxide film 2 is not exposed as a result of the etching in this step.

Figure 8:
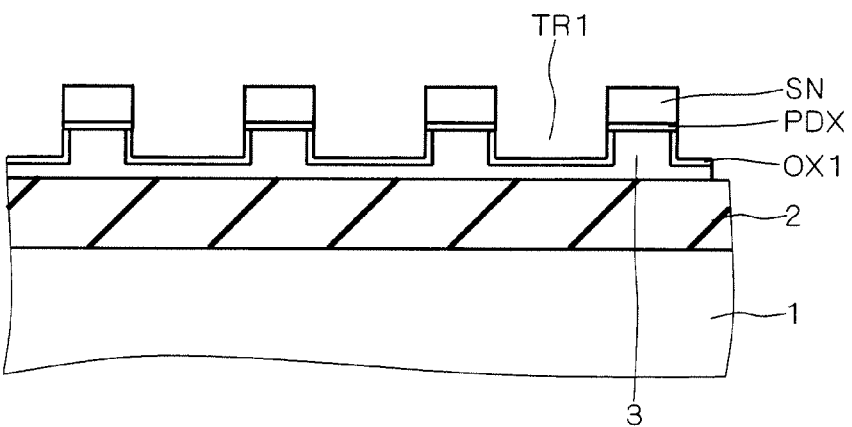

Then, the resist mask RM1 is removed, and the exposed portions of the SOI layer 3 are subjected to thermal oxidation at a temperature in a range from 700 to 1100° C. in the step illustrated in FIG. 8. As a result, a silicon oxide film OX1 with a thickness in a range from 5 to 30 nm is formed.

Subsequently, a resist mask RM2 is formed on the SOI substrate SB by patterning in the step illustrated in FIG. 9. The resist mask RM2 is patterned to include openings which expose only respective predetermined portions of the partial trenches TR1. More specifically, the openings of the patterned resist mask RM2 are located in regions where respective portions of the trench isolation films 4 with the hybrid-trench isolation structure (FIG. 3), each of which portions passes through the SOI layer 3 and reaches the buried oxide film 2, are to be later formed.

Then, etching is performed on the partial trenches TR1 in accordance with the pattern of the openings in the resist mask RM2 in the step illustrated in FIG. 10. As a result, trenches TR2 which expose the buried oxide film 2 are formed. Thereafter, the resist mask RM2 is removed.

Figure 14:
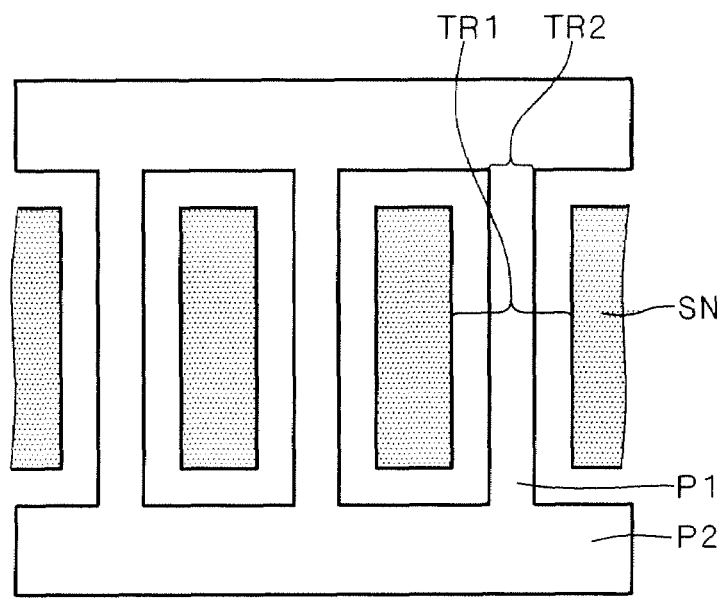
FIG. 14 is a plan view of the resistor region of the semiconductor device according to the preferred embodiment in the course of manufacture thereof.

A plan view (a view of the main surface) of the SOI substrate SB provided after the resist mask RM2 is removed is illustrated in FIG. 14.

As illustrated in FIG. 14, in plan view, the trenches TR2 include plural elongated first regions P1 which are arranged at intervals along shorter lengths thereof, and elongated second regions P2 which extend over end portions of the plural first regions P1, which end portions are opposite across the longer lengths of the plural first regions P1. It is additionally noted that in each of the first regions P1 and the second regions P2, the buried oxide film 2 is exposed.

After the step illustrated in FIG. 10, a silicon oxide film OX2 with a thickness in a range from 150 to 600 nm is formed to extend over the SOI substrate SB, so that the trenches TR1 and TR2 are completely filled with the silicon oxide film OX2, in the step illustrated in FIG. 11.

The silicon oxide film OX2 is formed by a high density plasma CVD (HDP-CVD) process, for example. In the HDP-CVD process, the density of plasma is one order or two orders of magnitude higher than that of plasma used in a general plasma CVD process, and sputtering and deposition are simultaneously performed using such high density plasma, to deposit an oxide film. As such, a high quality silicon oxide film can be obtained.

The silicon oxide film OX2 is formed over the silicon substrate SB so as to be thicker than the trenches TR1 or trenches TR2. As such, the silicon oxide film OX2 is polished and planarized by a CMP process at least until a surface of the silicon nitride film SN is exposed. At this time, the silicon nitride film SN may be polished until the thickness thereof is halved.

Figure 12:
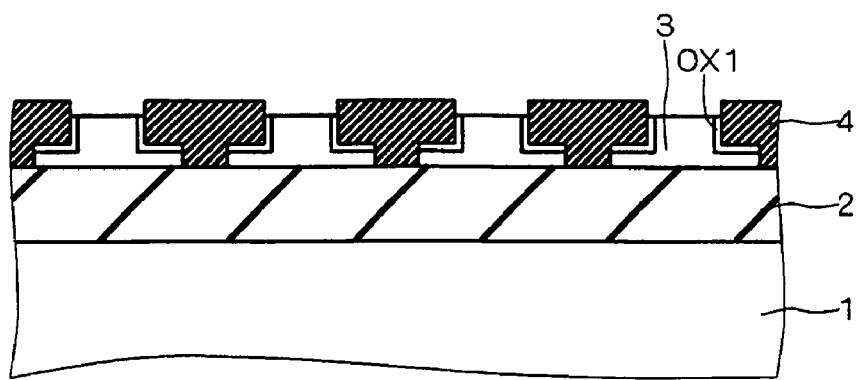
Figure 13:
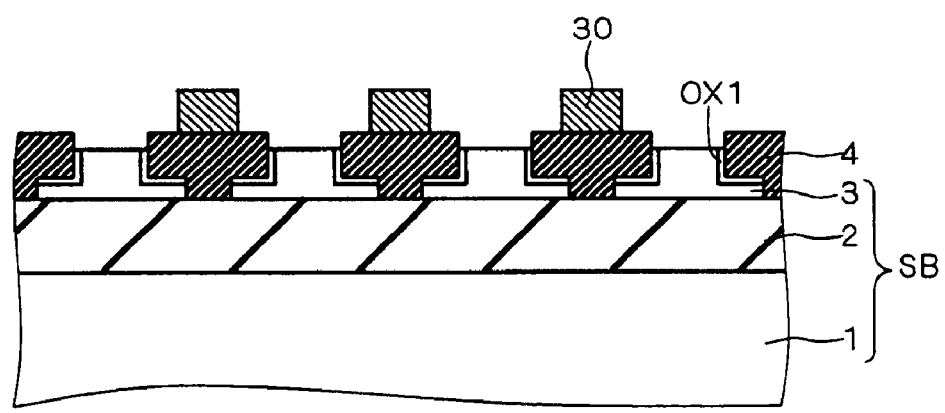

Then, in the step illustrated in FIG. 12, the silicon nitride film SN and the pad oxide film PDX are removed by wet etching or dry etching, to obtain the trench isolation films 4 each with the hybrid-trench isolation structure.

Formation of the trench isolation films 4 allows electrical isolation among the portions of the SOI layer 3 each of which is located between two adjacent ones of the trench isolation films 4.

It is noted that while FIG. 12 clearly illustrates the silicon oxide film OX1 on each of portions of the SOI layer 3 which faces a portion forming the partial-trench isolation structure in the trench isolation film 4, the silicon oxide film OX1 and each foregoing portion of the SOI layer 3 are regarded as an integral part, and the silicon oxide film OX1 is not illustrated in FIG. 2.

Further, in the steps described above, also the trench isolation film 4 (FIG. 2) for electrically isolating the NMOS region NR and the PMOS region PR from each other and the trench isolation films 4A each with the partial-trench isolation structure (FIG. 5), are formed.

After the trench isolation films 4 are formed, a polysilicon film is deposited to entirely cover the silicon substrate SB. The deposited polysilicon film is patterned, to thereby form the resistive elements 30 each having a desired configuration on the trench isolation films 4 in the step illustrated in FIG. 13. Details of formation of the resistive elements 30 will be provided in a later section dealing with manufacture of a semiconductor element.

Figure 15:
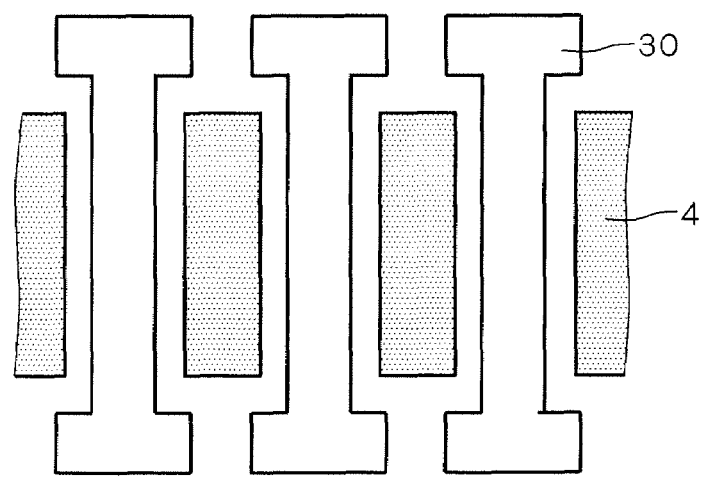
FIG. 15 is a plan view for explaining arrangement of resistive elements and an SOI layer of the semiconductor device according to the preferred embodiment of the present invention.

A plan view (a view of the main surface) of the SOI substrate SB provided after the resistive elements 30 are formed by patterning the polysilicon film is illustrated in FIG. 15.

As illustrated in FIG. 15, in plan view, each of the resistive elements 30 is the shape of a capital I. Respective elongated principal parts of the resistive elements 30 are located in positions where the plural first regions P1 are located in the plan view of FIG. 14. On the other hand, respective end parts of the resistive elements 30 which are widened relative to the principal parts are located in positions where the plural second regions P2 are located in the plan view of FIG. 14. The end parts serve as electrical contacts.

To form the trenches TR2 so as to have the plan view illustrated in FIG. 14 results in provision of portions of the SOI layer 3 each of which is completely surrounded by the trench isolation films 4. Each of the completely-surrounded portions of the SOI layer 3 can be electrically isolated from other elements.

While each of the completely-surrounded portions of the SOI layer 3 is electrically floating, a potential of each of those portions of the SOI layer 3 can be fixed by connecting a contact portion.

Alternatively, the trenches TR2 may be formed so as to have a plan view in which each of the second regions P2 illustrated in FIG. 14 is divided into smaller regions so that the SOI layer 3 does not include a completely-surrounded portion, instead of the plan view illustrated in FIG. 14.

B-2. Manufacture of Semiconductor Element

Below, a method of manufacturing a semiconductor element will be described with reference to FIGS. 16 through 25 which illustrate steps for manufacturing a semiconductor element in order of occurrence. It is noted that each of FIGS. 16 through 25 illustrates examples of the resistor region and the element region.

In the above-described steps illustrated in FIGS. 6 through 12, the trench isolation films 4 each including a portion having the partial-trench isolation structure (not shown) are formed in a surface of a predetermined portion of the SOI layer 3. Then, a pad oxide film PDX1 with a thickness in a range from 5 to 30 nm is formed on the SOI layer 3 by thermal oxidation. The pad oxide film PDX1 can be obtained by either newly forming a pad oxide film or remaining the pad oxide film PDX which has been formed in the step illustrated in FIG. 6.

Subsequently, a resist mask RM11 patterned to include an opening which exposes the NMOS region NR is formed on the SOI substrate SB in the step illustrated in FIG. 16. Then, ion implantation of P-type impurities such as boron (B) into the SOI layer 3 is performed through the opening (channel doping). The ion implantation at this stage is intended to determine a threshold voltage of a transistor. The implantation energy for this implantation is determined so as to allow formation of an impurity layer in the vicinity the main surface of the SOI layer 3.

Figure 17:
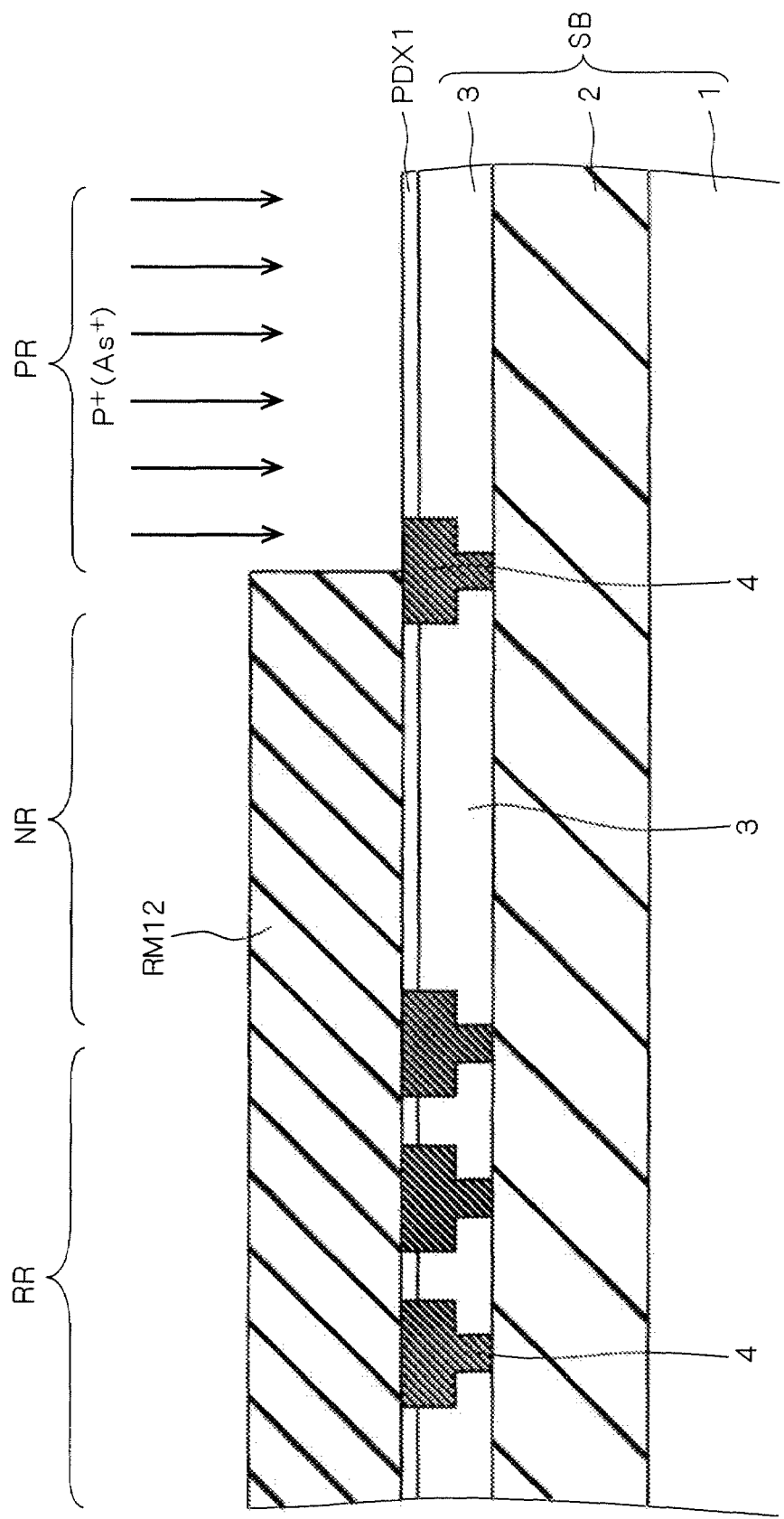
Figure 18:
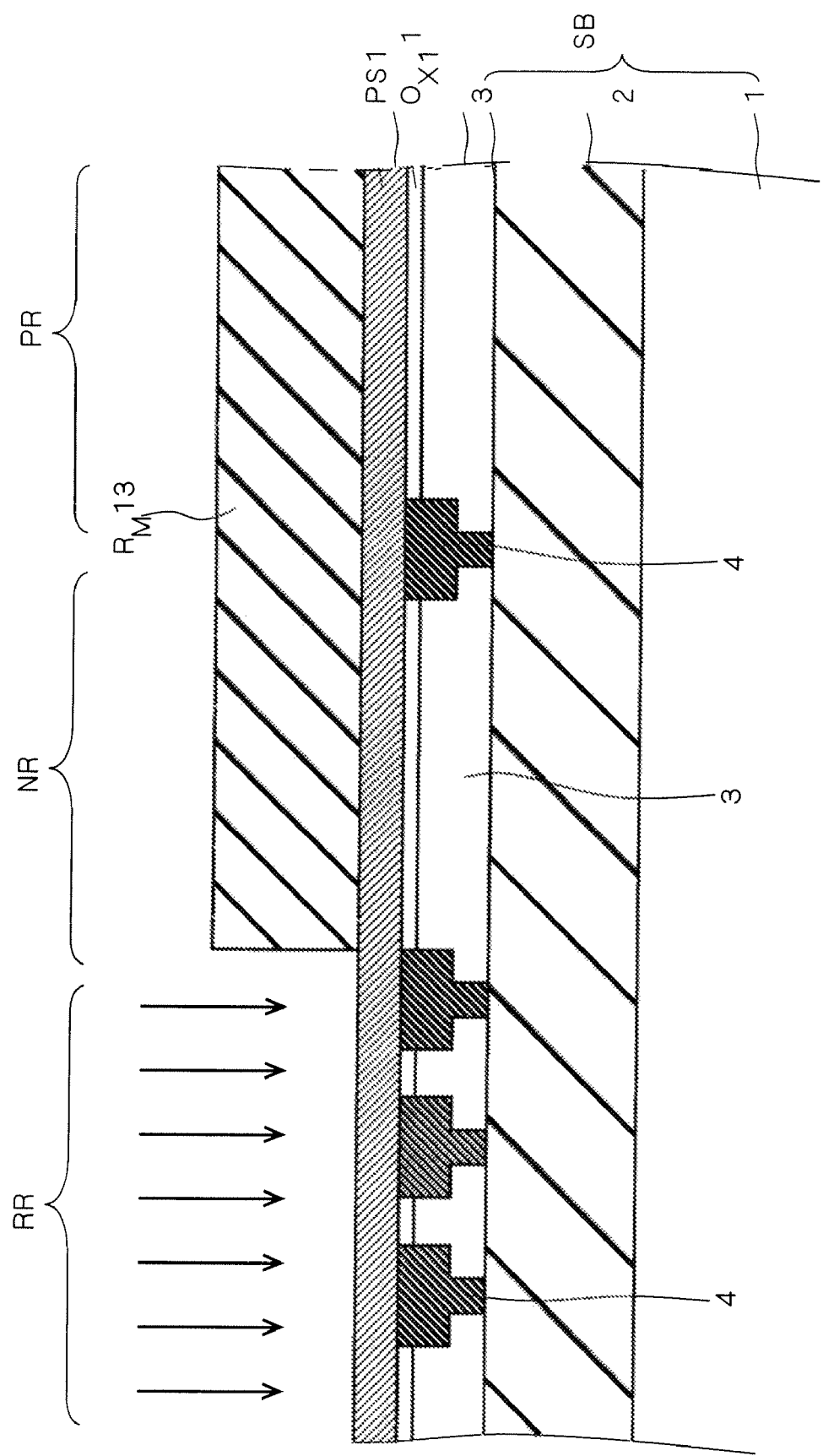

Next, the resist mask RM11 is removed, and thereafter a resist mask RM12 patterned to include an opening which exposes the PMOS region PR is formed in the step illustrated in FIG. 17. Then, ion implantation of N-type impurities such as phosphorus (P) or arsenic (As) into the SOI layer 3 is performed through the opening (channel doping).

In each of the foregoing steps for channel doping, no impurity is implanted into the SOI layer 3 in the resistor region RR. Thus, increase in impurity concentration of the SOI layer 3 in the resistor region RR is prevented, so that the resistance of the SOI layer 3 can be kept high in the resistor region RR. Also, depending on a voltage, the SOI layer 3 can be fully depleted in the resistor region RR, so that a parasitic capacitance of each of the resistive elements 30 can be reduced.

More specifically, a central portion of each of the trench isolation films 4 has the full-trench isolation structure, and thus a parasitic capacitance of that portion is small. On the other hand, each of opposite side portions of each of the trench isolation films 4 has the partial-trench isolation structure and is located on the SOI layer 3. Because of a small thickness of the silicon oxide film forming the side portions of the films 4, each of the side portions of each of the trench isolation films 4 should have a high capacitance. However, if the SOI layer 3 is fully depleted, it is substantially equivalent to increase in thickness of the silicon oxide film. As a result, a parasitic capacitance of each of the opposite side portions of each of the trench isolation films 4 can be reduced.

Then, the resist mask RM12 is removed, and the pad oxide film PDX1 is completely removed. Subsequently, a silicon oxide film OX11 which is to serve as a gate insulating film is formed on the exposed surface of the SOI layer 3 in the step illustrated in FIG. 18. Thereafter, a polysilicon layer PS1 which is to serve as gate electrodes 12 and 22 and the resistive elements 30 are deposited to entirely cover the SOI substrate SB by a CVD process, for example. The deposition of the polysilicon layer PS1 in this step is performed at a temperature in a range from 600 to 800° C. Alternatively, the deposition of the polysilicon layer PS1 may be achieved by sputtering at a temperature in a range from 400 to 600° C.

Then, a resist mask RM13 patterned to include an opening which exposes the resistor region RR is formed on the polysilicon layer PS1, and ion implantation of impurities into the polysilicon layer PS1 is performed through the opening. For the ion implantation in this step, the impurities may be of either P-type (B) or N-type (P, As), and the dose is selected from a range from $0.2 \times 10^{15}$ to $5 \times 10^{15}/cm^2$. This ion implantation is intended to determine a resistance of the polysilicon layer PS1. Thus, by employing polysilicon as a material for the resistive elements 30, it is possible to arbitrarily determine the resistance.

It is noted that when it is desired that the threshold voltage is reduced, impurities are implanted into portions of the polysilicon layer PS1 which are to be used as the gate electrodes of the NMOS region NR and the PMOS region PR (gate doping). This implantation of impurities serves to reduce a difference in work function between each of the gate electrodes and a silicon layer and suppress depletion of the gate, to thereby reduce the threshold voltage. To this end, a resist mask including openings which expose the resistor region RR and one of the NMOS region NR and the PMOS region PR is formed in place of the resist mask RM13, and ion implantation of impurities is performed using the resist mask. In this case, when ion implantation is performed on the respective portions of the polysilicon layer PS1 which are located in the resistor region RR and the NMOS region NR, N-type impurities are employed. On the other hand, ion implantation is performed on the respective portions of the polysilicon layer PS1 which are located in the resistor region RR and the PMOS region PR, P-type impurities are employed.

Figure 19:
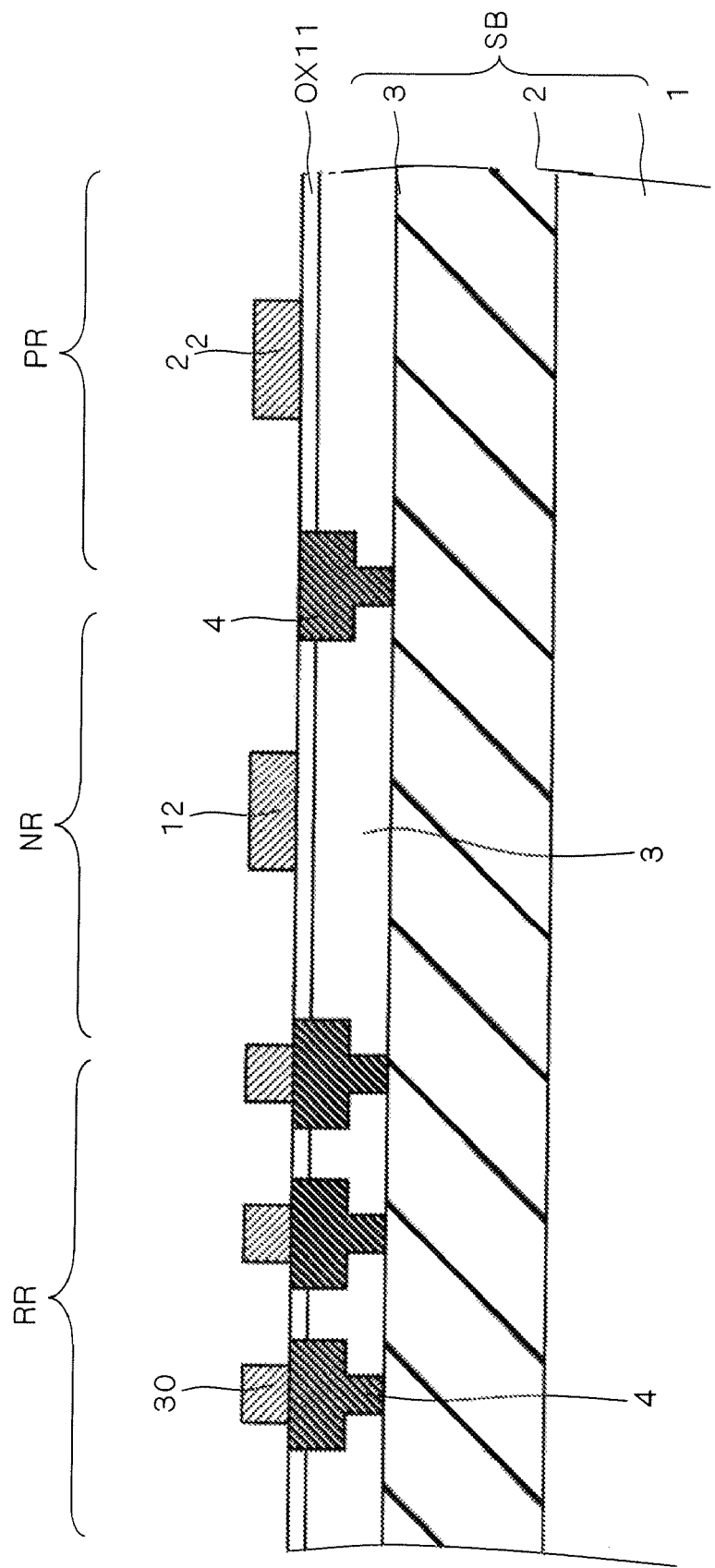

After the resist mask RM13 is removed, the polysilicon layer PS1 is patterned in the NMOS region NR and the PMOS region PR, to form the gate electrodes 12 and 22 on the silicon oxide film OX11, in the step illustrated in FIG. 19. Also, the polysilicon layer PS1 is patterned in the resistor region RR, to form the resistive elements 30 on the trench isolation films 4.

Figure 20:
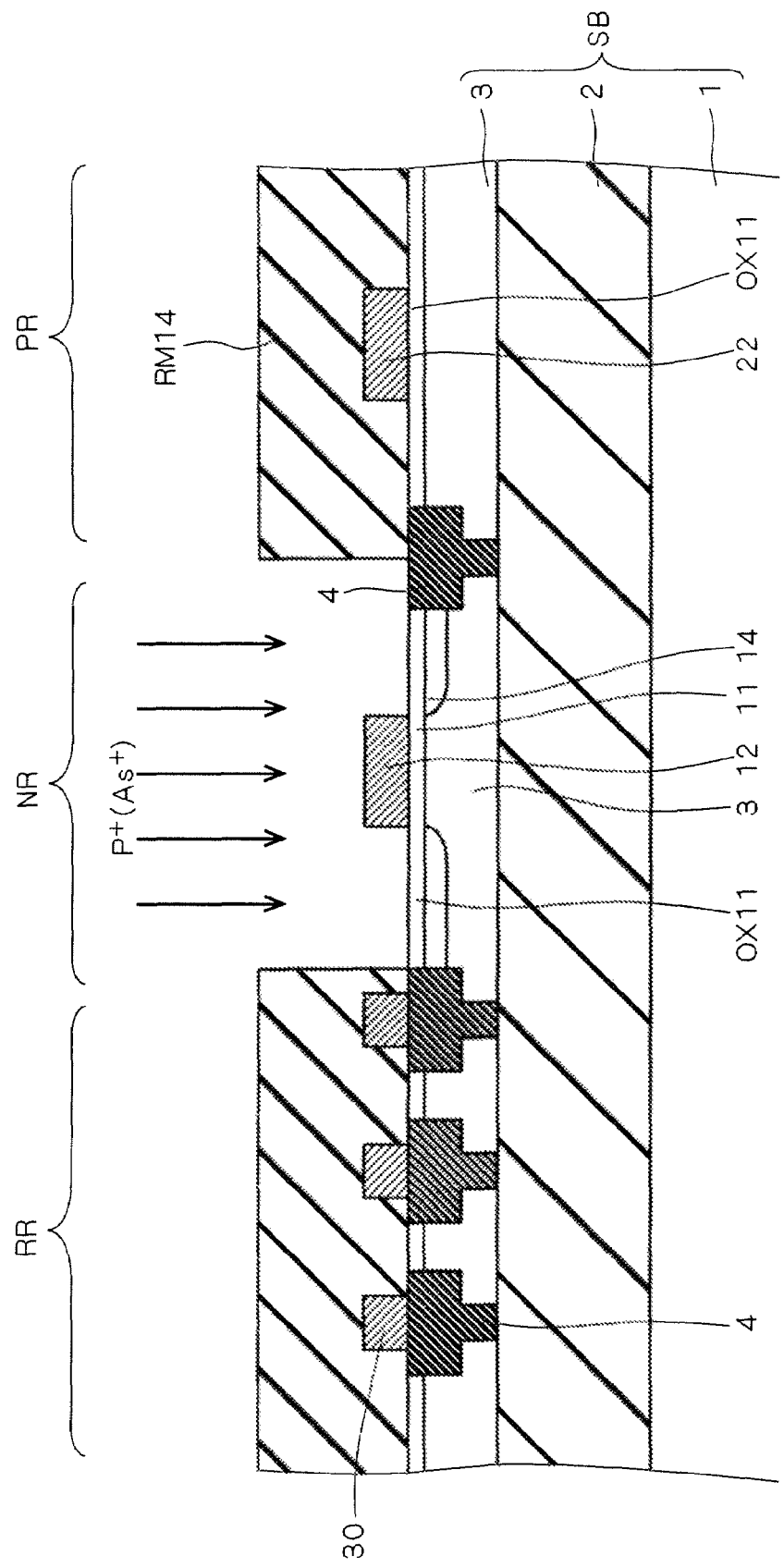

Subsequently, in the step illustrated in FIG. 20, a resist mask RM14 patterned to include an opening which exposes the NMOS region NR is formed on the SOI substrate SB, and ion implantation of N-type impurities (P or As, for example) into the SOI layer 3 is performed through the opening, to form the extension layers 14 (extension doping). In this ion implantation, the gate electrode 12 functions as a mask.

Figure 21:
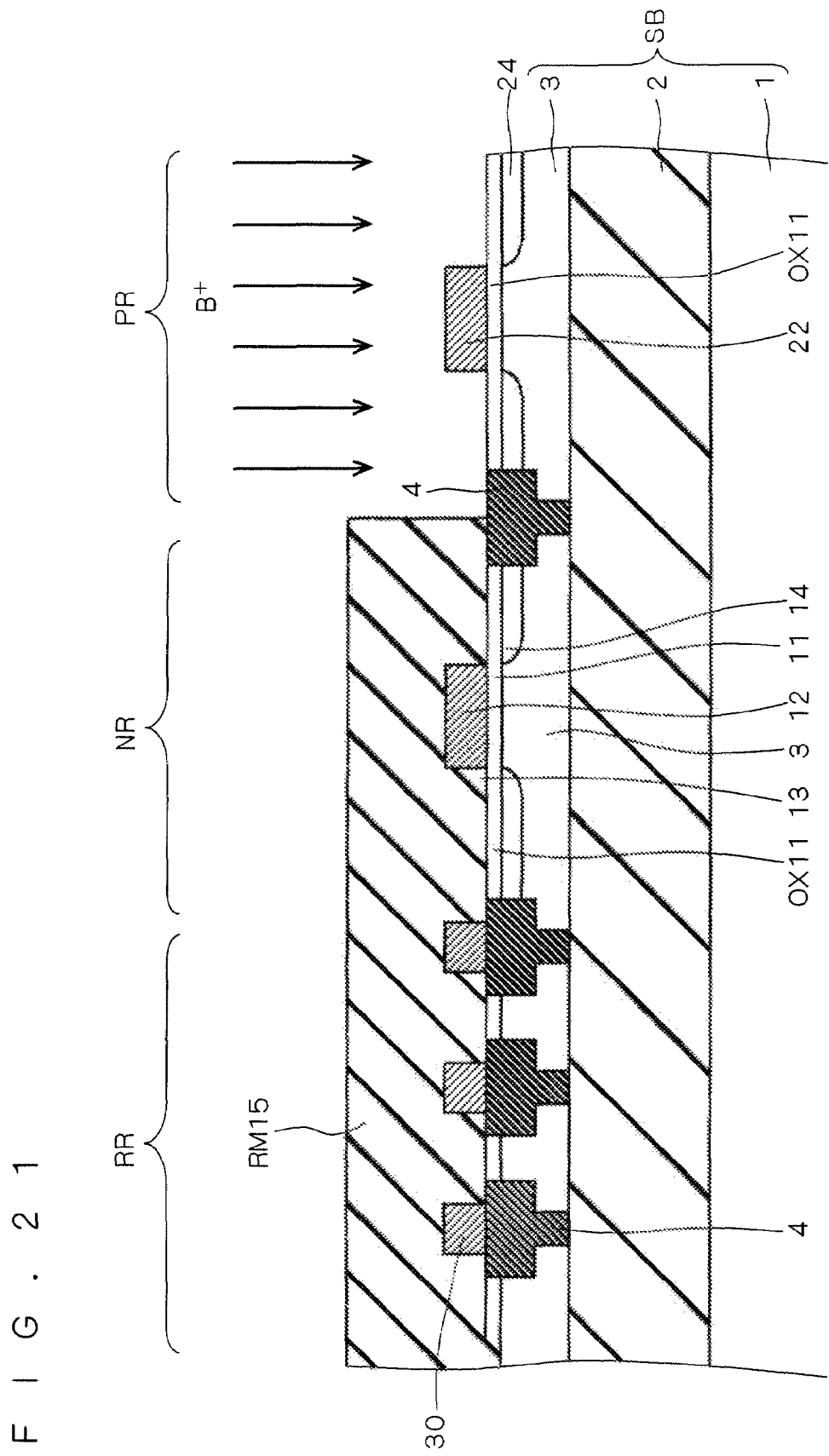

Subsequently, the resist mask RM14 is removed, and a resist mask RM15 patterned to include an opening which exposes the PMOS region PR is formed on the SOI substrate SB in the step illustrated in FIG. 21. Then, ion implantation of P-type impurities (B, for example) into the SOI layer 3 is performed through the opening, to form the extension layers 24 (extension doping). In this ion implantation, the gate electrode 22 functions as a mask.

In each of the foregoing steps for extension doping, no impurity is implanted into the SOI layer 3 in the resistor region RR. Thus, increase in impurity concentration of the SOI layer 3 in the resistor region RR is prevented, so that the resistance of the SOI layer 3 can be kept high in the resistor region RR. Also, depending on a voltage, the SOI layer 3 can be fully depleted in the resistor region RR, so that a parasitic capacitance of each of the resistive elements 30 can be reduced.

After the resist mask RM15 is removed, the sidewall insulating films 13 and 23 each including a silicon oxide film, for example, are formed on side faces of the gate electrodes 12 and 22, respectively. Also, the sidewall insulating film 33 including a silicon oxide film, for example, is formed on each side face of the resistive elements 30. During the formation of the sidewall insulating films 13, 23, and 33, an unnecessary portion of the silicon oxide film OX11 is removed, to form the gate insulating films 11 and 21 under the gate electrodes 12 and 22, respectively.

Figure 22:
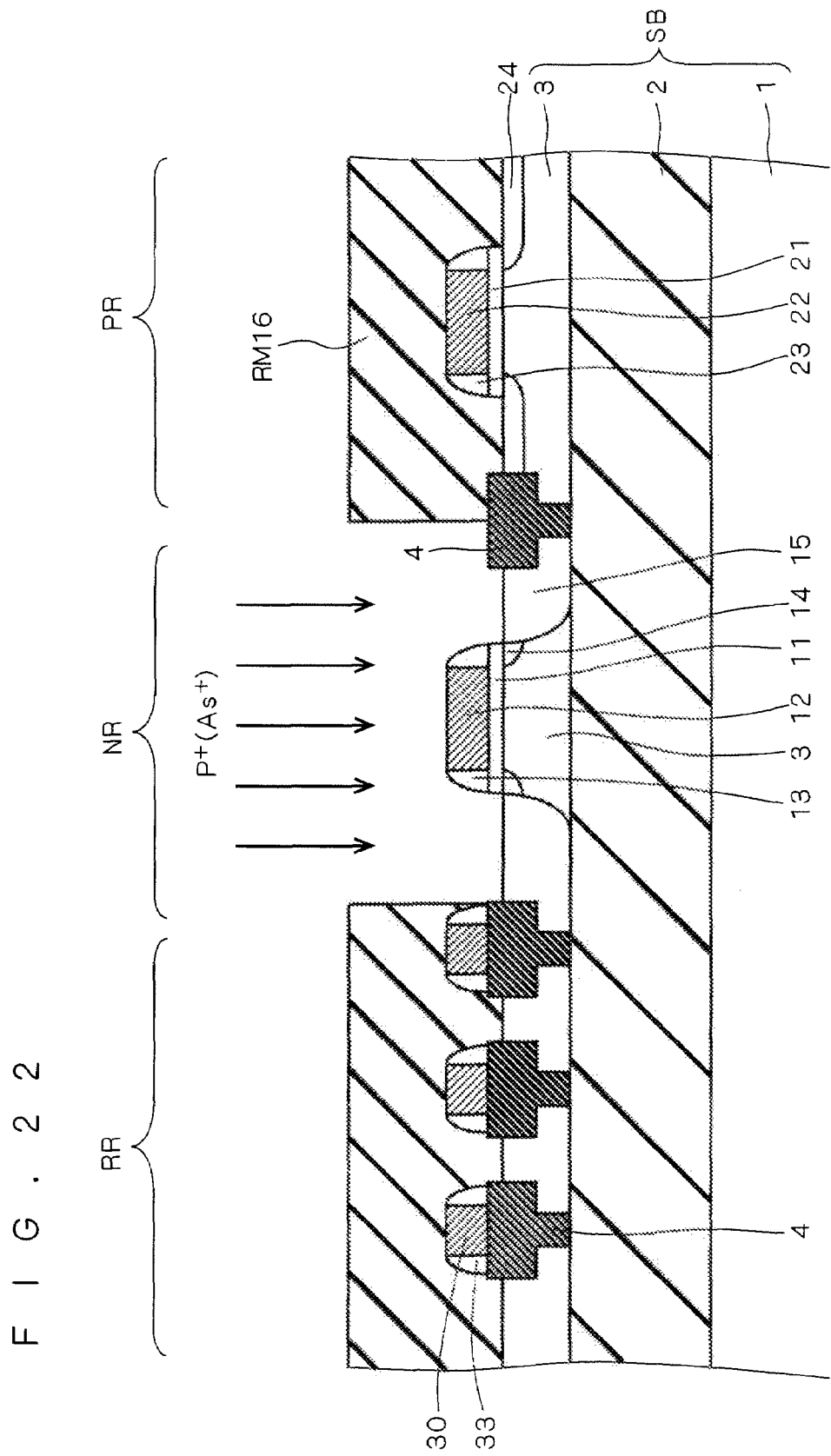

In the step illustrated in FIG. 22, a resist mask RM16 patterned to include an opening which exposes the NMOS region NR is formed on the SOI substrate SB, and ion implantation of N-type impurities (P or As, for example) into the SOI layer 3 is performed through the opening, to form the source/drain layers 15 (source/drain doping). In this ion implantation, the gate electrode 12 and the sidewall insulating films 13 function as masks.

Figure 23:
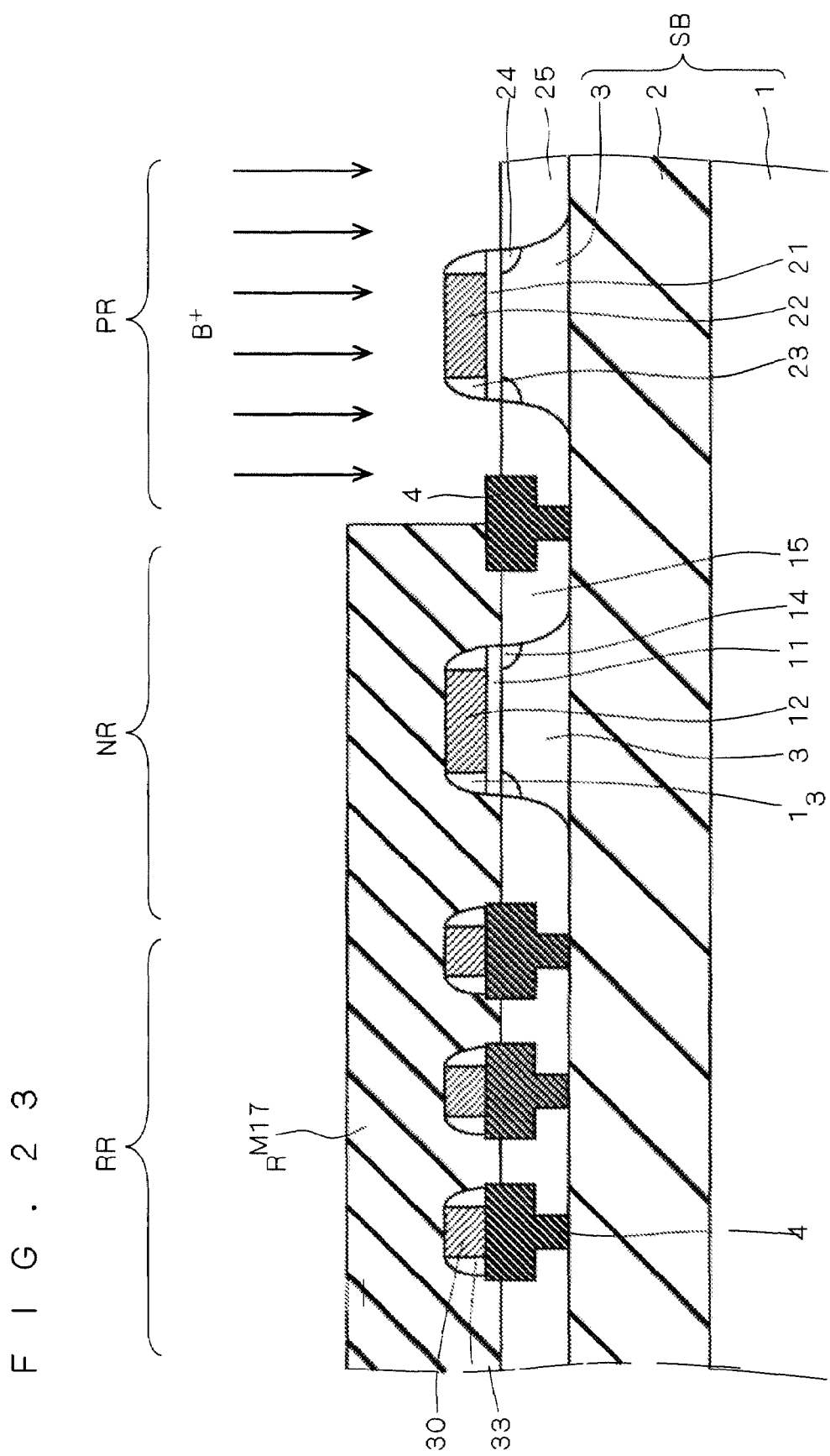

After the resist mask RM16 is removed, a resist mask RM17 patterned to include an opening which exposes the PMOS region PR is formed on the SOI substrate SB in the step illustrated in FIG. 23. Then, ion implantation of P-type impurities (B, for example) into the SOI layer 3 is performed through the opening, to form the source/drain layers 25 (source/drain doping). In this ion implantation, the gate electrode 22 and the sidewall insulating films 23 function as masks.

In each of the foregoing steps for source/drain doping, no impurity is implanted into the SOI layer 3 in the resistor region RR. Thus, increase in impurity concentration of the SOI layer 3 in the resistor region RR is prevented, so that the resistance of the SOI layer 3 can be kept high in the resistor region RR. Also, depending on a voltage, the SOI layer 3 can be fully depleted in the resistor region RR, so that a parasitic capacitance of each of the resistive elements 30 can be reduced.

Additionally, another impurity layer (pocket layer) which is of a conductivity type opposite to that of the source/drain layers and laterally protrudes from each of the extension layers may be formed by ion implantation. However, also in formation of the pocket layer, attention should be paid to prevent an impurity from being implanted into the SOI layer 3 in the resistor region RR.

Figure 24:
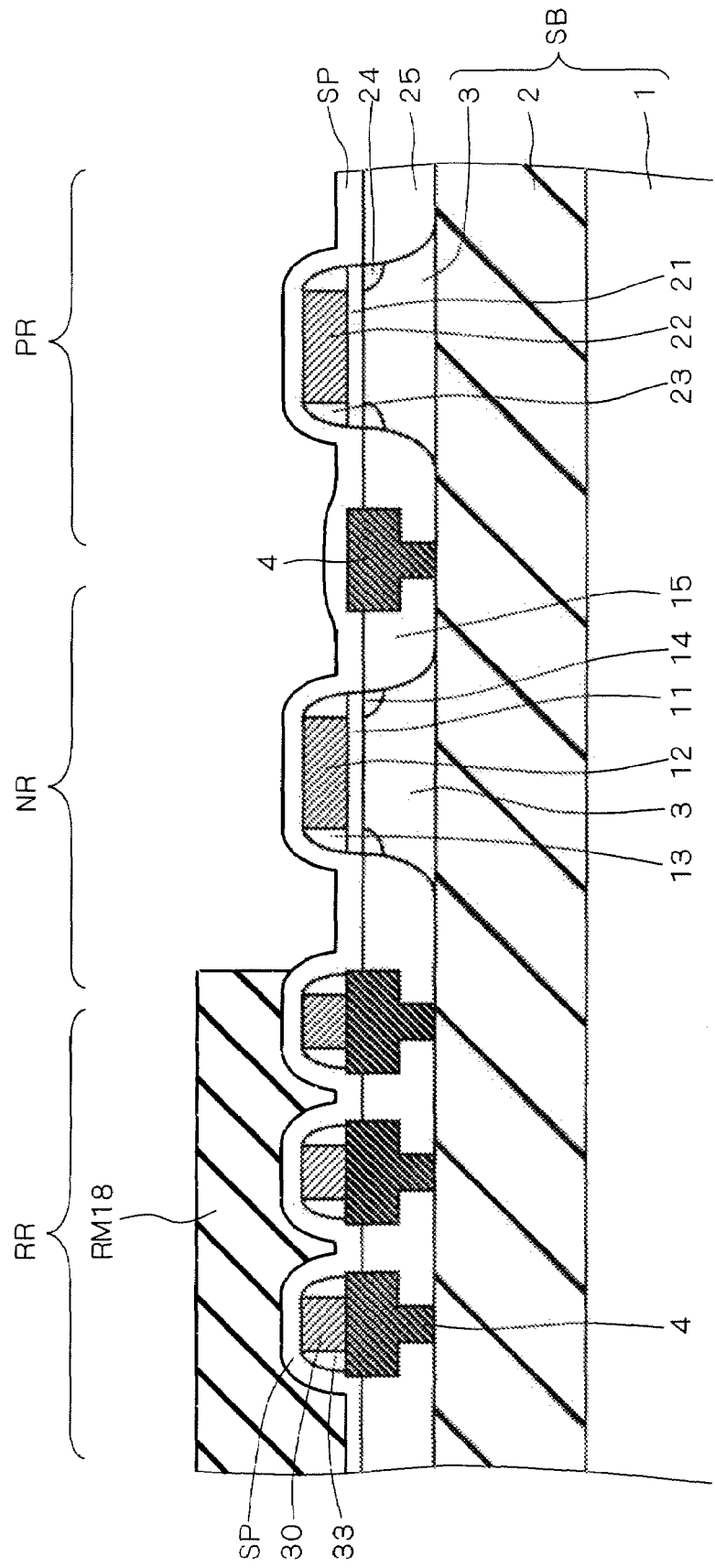

After the resist mask RM17 is removed, the silicide protection film SP with a thickness in a range from 10 to 100 nm is formed so as to entirely cover the main surface of the SOI substrate SB by a CVD process in the step illustrated in FIG. 24. The silicide protection film SP includes an insulating film such as a silicon oxide film or a silicon nitride film.

The silicide protection film SP is a film for protecting a region where a silicide film must not be formed. Thus, a resist mask RM18 including an opening which exposes each region where formation of a silicide film is required is formed on the silicide protection film SP, and each portion of the silicide protection film SP which is exposed in the opening is removed by etching.

It is noted that though it appears that the resistor region RR is entirely covered with the resist mask RM18 in FIG. 24, end portions of each of the resistive elements 30, which end portions are opposite to each other across a longer length of each of the resistive elements 30, on which the silicide film SS is to be later formed as described above with reference to FIGS. 2 and 4, is not covered with the resist mask RM18.

Figure 25:
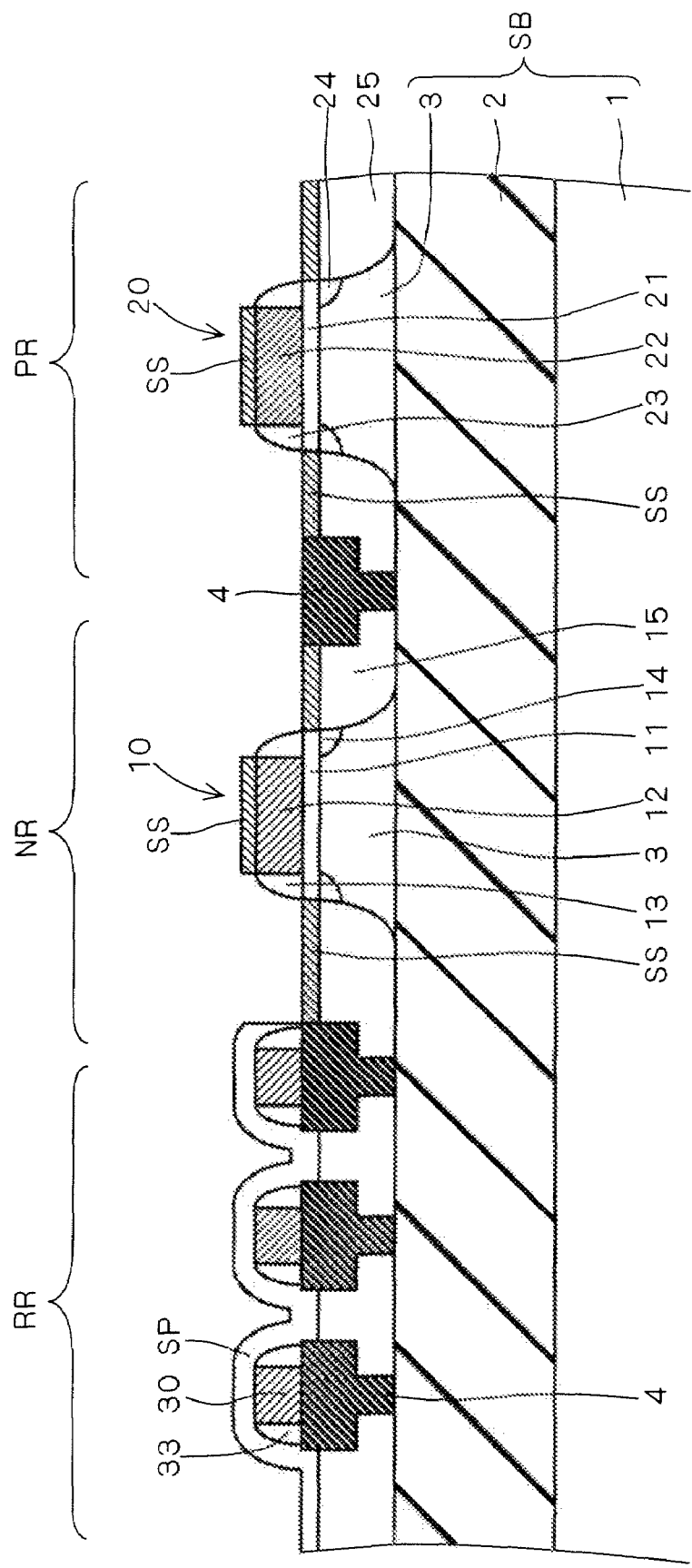
Figure 26:
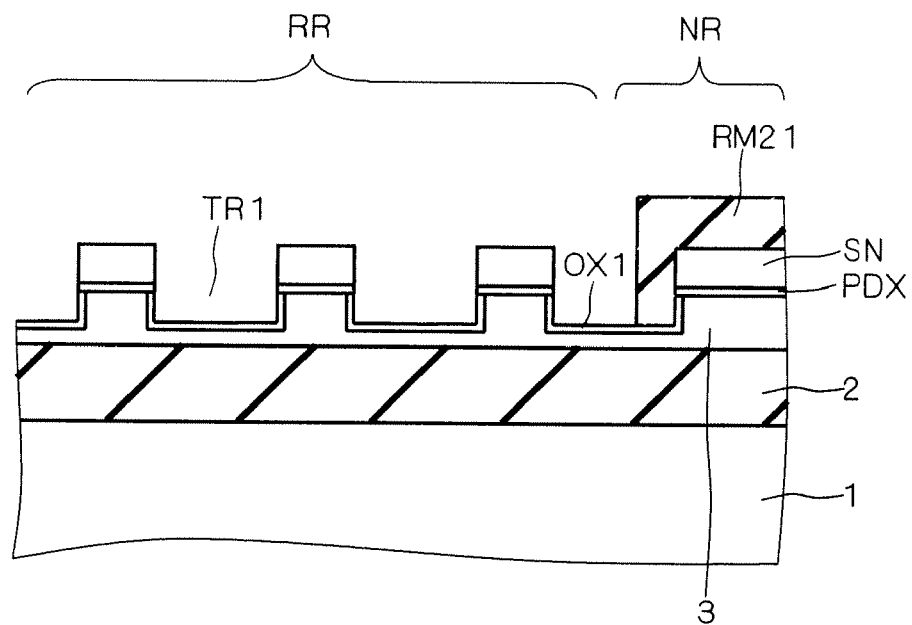
FIGS. 26, 27, 28, and 29 are sectional views for explaining a method of manufacturing a resistor region of a semiconductor device according to a second modification of the preferred embodiment of the present invention.

After the resist mask RM18 is removed, refractory metal layer such as cobalt (Co) is formed to entirely cover the SOI substrate SB by sputtering in the step illustrated in FIG. 25. Then, heat treatment is performed, to cause silicidation between silicon and the metal layer, to form the silicide films SS. Since silicidation does not occur between an insulating film and the metal layer, portions of the metal layer which are located on the sidewall insulating films 13 and 23 and the silicide protection film SP remain un-reacted. The un-reacted portions of the metal layer are removed, to thereby form the silicide films SS selectively on the gate electrodes 12 and 22 and the source/drain layers 15 and 25.

A material for the metal layer having a high melting point is not limited to Co. Any metal which can cause silicidation and reduce a contact resistance to a contact portion, such as titanium (Ti), tungsten (W), molybdenum (Mo), or nickel (Ni), may be alternatively used.

Thereafter, the interlayer insulating film 5 is formed to entirely cover the main surface of the SOI substrate SB, and the contact portions CH passing through the interlayer insulating film 5 and reaching the silicide films SS are formed. Further, the wiring layers WR and WL are connected to the contact portions CH. Then, the spiral inductor SI is formed above the interlayer insulating film 5, to complete the SOI device 100 illustrated in FIG. 3.

C. Special Effects

In the above-described SOI device 100, the trench isolation films 4 each with the hybrid-trench isolation structure are provided at intervals in a surface of the SOI layer 3 in the resistor region RR which is located below the spiral inductor SI, with portions of the SOI layer 3 interposed therebetween. Accordingly, the SOI device 100 does not include a single trench isolation film which extends over a wide area. Hence, dishing does not occur during a CMP process for formation of the trench isolation films 4.

As mentioned above, dishing does not occur in the resistor region RR. Thus, a region below the spiral inductor SI can be effectively used in forming the resistive elements 30, which prevents increase in a total area of the device.

Also, since the resistive elements 30 can be formed below the spiral inductor SI, the structure of SOI device 100 is suitable for a high-frequency analog circuit or the like.

Further, impurity implantation into the SOI layer 3 is prevented in the resistor region RR during formation of the semiconductor element. Thus, the resistance of the SOI layer 3 can be kept high in the resistor region RR. Also, depending on a voltage, the SOI layer 3 can be fully depleted in the resistor region RR, so that a parasitic capacitance of each of the resistive elements 30 formed on the trench isolation films 4 can be reduced. This facilitates high frequency operation.

Moreover, while the NMOS region NR and the PMOS region PR are electrically isolated from each other by the trench isolation film 4, the body-potential fixing region BR1 and the portion of the SOI layer 3 located under the gate electrode 12 of the MOS transistor 10 in the NMOS region NR are electrically connected to each other via the portion of the SOI layer 3 located under the trench isolation film 4A having the partial-trench isolation structure, as described above with reference to FIG. 5 (also, the similar electrical connection is established in the PMOS region PR). As a result, floating body effects can be suppressed, so that occurrence of a kink due to accumulation of carriers (holes in the NMOS region NR) in the channel region can be prevented. Hence, the structure of the SOI device 100 is suitable for an analog circuit.

Still further, a delay time is prevented from becoming frequency-dependent due to unstable potential of the channel region. This eliminates a need for an extra timing margin in circuit design. Hence, high-speed operation can be most effectively utilized, and the structure of the SOI device 100 is suitable for a digital circuit.

D. First Modification

According to the above-described preferred embodiment, implantation of impurities into the SOT layer 3 is prevented in the resistor region RR during formation of the semiconductor element. By doing so, the resistance of the SOI layer 3 can be kept high in the resistor region RR, and also, the SOI layer 3 can be fully depleted in the resistor region RR, depending on a voltage. In contrast thereto, to implant impurities into the resistive elements 30 at the time of source/drain doping, for example, would allow reduction of a resistance of each of the resistive elements 30. To this end, not a resist mask including an opening which exposes the whole resistor region RR, but a resist mask including openings which expose only the resistive elements 30, respectively, in the resistor region RR, is formed so that implantation of impurities into the portions of the SOI layer 3 interposed between the trench isolation films 4 can be prevented.

In forming the resist mask including openings which expose only the resistive elements 30, respectively, it is desired to determine a width of each of the trench isolation films 4 in the resistor region RR to be as large as possible, taking into consideration a margin for patterning in the resist mask.

However, there is a possibility that the width of each of the trench isolation films 4 in the resistor region RR cannot be increased because of an area constraint on the device, to fail to form the resist mask including openings which expose only the resistive elements 30, respectively. Even in such case, if higher importance is attached to reduction of the resistance of each of the resistive elements 30, implantation of impurities into the SOI layer 3 in the resistor region RR during formation of the semiconductor element is permitted. It should be noted that even though impurities are implanted into the SOI layer 3 in the resistor region RR, a central portion of each of the trench isolation films 4 includes the full-trench isolation structure so that a parasitic capacitance of the corresponding portion is small. Accordingly, some degree of increase in parasitic capacitance at side portions of each of the trench isolation films 4 would not significantly affect.

E. Second Modification

According to the above-described preferred embodiment, the trench isolation films 4 each with the hybrid-trench isolation structure are provided at intervals with portions of the SOI layer 3 interposed therebetween, and the resistive elements 30 are formed on the trench isolation films 4, respectively, in the resistor region RR. Alternatively, trench isolation films each with the full-trench isolation structure may be provided in place of the trench isolation films 4, in the resistor region RR. Below, a structure according to a second modification, which includes the trench isolation films each with the full-trench isolation structure in the resistor region RR, as well as manufacture thereof, will be described with reference to FIGS. 26, 27, 28, and 29. FIGS. 26, 27, 28 and 29 illustrate steps for manufacturing the trench isolation films according to the second modification in order of occurrence.

After the steps illustrated in FIGS. 6, 7, and 8 are performed, the silicon oxide film OX1 is formed on an inner wall of each of the trenches TR1. Subsequently, in the step illustrated in FIG. 26, a half of one of the trenches TR1 located on a border between the NMOS region NR and the resistor region RR, which half is closer to the NMOS region NR, and a predetermined region of the NMOS region NR, are covered with a resist mask RM21. No resist mask is formed on a remaining region of the resistor region RR, which is then exposed.

Figure 27:
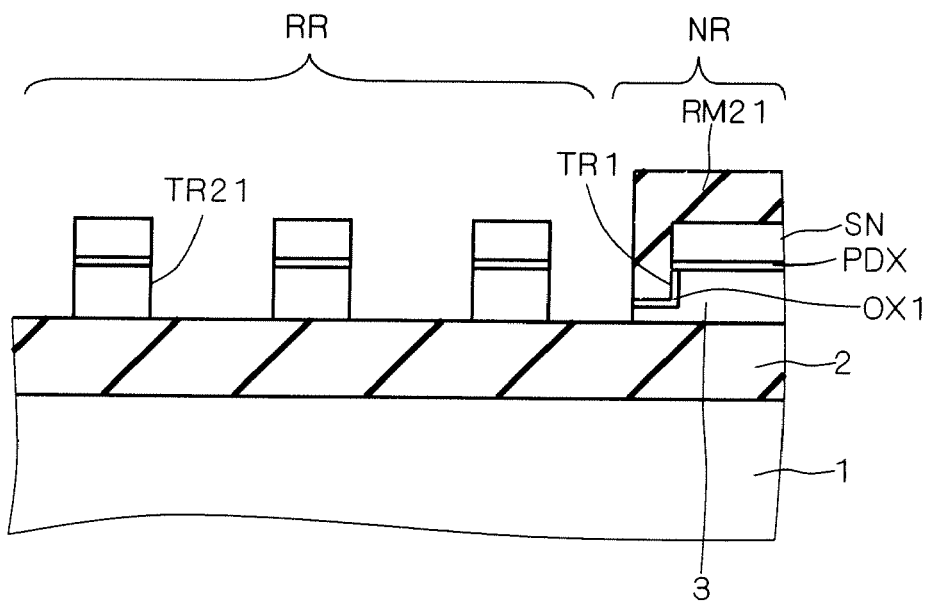

Next, in the step illustrated in FIG. 27, etching is performed on the trenches TRI using the silicon nitride film SN and the resist mask RM21 as etching masks, to expose the buried oxide film 2. As a result of this etching, each of all the trenches TRI in the resistor region RR except the trench TRI located on the border between the NMOS region NR and the resistor region RR becomes a full trench TR21, by the buried oxide film 2 is exposed. In the trench TR1 located on the border between the NMOS region NR and the resistor region RR, only a half thereof becomes the full trench TR21.

Figure 28:
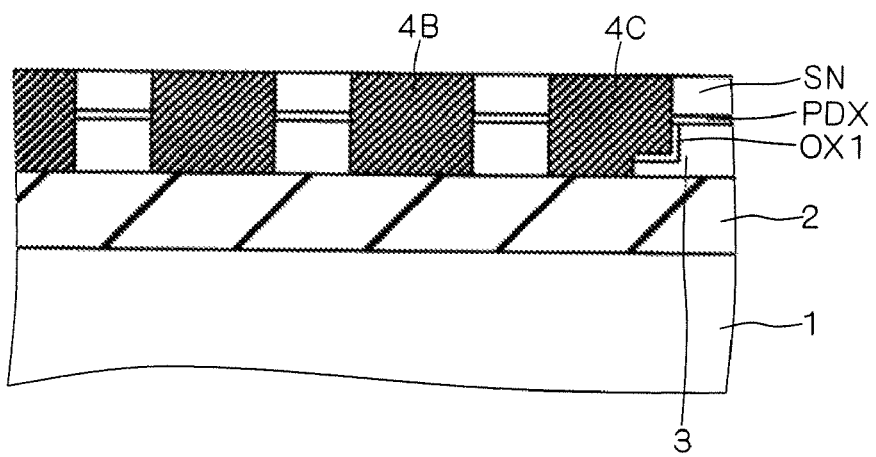

After the resist mask RM21 is removed, the silicon oxide film OX2 with a thickness in a range from 15 to 600 nm is formed to extend over the SOI substrate SB to completely fill the trenches TR21 and TRI with the silicon oxide film OX2, in the step illustrated in FIG. 28. The step illustrated in FIG. 28 is identical to the step illustrated in FIG. 11, and thus, detailed description therefor is not provided herein.

Figure 29:
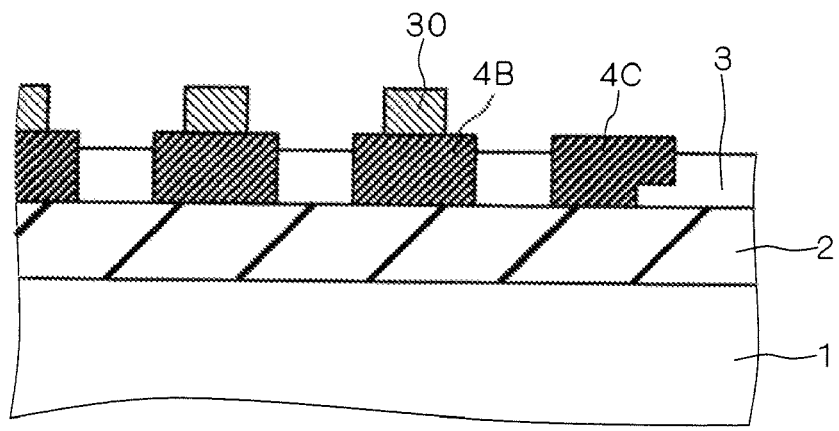

Then, in the step illustrated in FIG. 29, the silicon nitride film SN and the pad oxide film PDX are removed by wet etching or dry etching, to obtain trench isolation films 4B each with the full-trench isolation structure and a trench isolation film 4C including a half with the partial-trench isolation structure and the other half with the full-trench isolation structure. Thereafter, the resistive elements 30 each configured as desired are formed on the trench isolation films 4B and 4C, respectively.

In the above-described structure according to the second modification, each of the trench isolation films 4B on which the resistive elements 30 are formed has the full-trench isolation structure. Accordingly, a parasitic capacitance of each of the resistive elements 30 can be further reduced.

Also, it becomes unnecessary to pattern a resist mask in the resistor region RR. This eliminates a need of considering a margin for patterning, so that a width of each of the trenches TRI or an interval between two adjacent ones of the trenches TR1 can be reduced. As a result, an interval between two adjacent ones of the resistive elements 30 can be reduced, to allow for a much higher level of integration.

F. Third Modification

According to the above-described preferred embodiment, implantation of impurities into the SOI layer 3 is prevented in the resistor region RR during formation of the semiconductor element. By doing so, the resistance of the SOI layer 3 can be kept high in the resistor region RR, and also the SOT layer 3 can be fully depleted in the resistor region RR, depending on a voltage. In this regard, not only the SOI layer 3 in the resistor region RR, but also the trench isolation films 4 in the resistor region RR, are not subjected to implantation of impurities. As a result, a thickness of each of the trench isolation films in the resistor region RR can be made larger than that in the element region.

Specifically, to implant impurities into the trench isolation films would increase an etching rate in hydrofluoric acid (HF) etching which is to be later performed for removing the silicon oxide film.

For example, as described above with reference to FIG. 16, ion implantation via the pad oxide film PDX1 is performed for channel doping, and the pad oxide film PDX1 is removed after the ion implantation. When HF etching is performed in order to remove the pad oxide film PDX1, the etching proceeds more quickly in the trench isolation films 4 in the element region than in the trench isolation films 4 in the resistor region so that the thickness of each of the trench isolation films 4 in the element region becomes smaller than that in the resistor region RR, because impurities have been implanted into each of the trench isolation films 4 in the NMOS region NR and the PMOS region PR (the element region) during the channel doping. The similar phenomenon occurs in the step of forming the gate insulating films 11 and 21.

Figure 30:
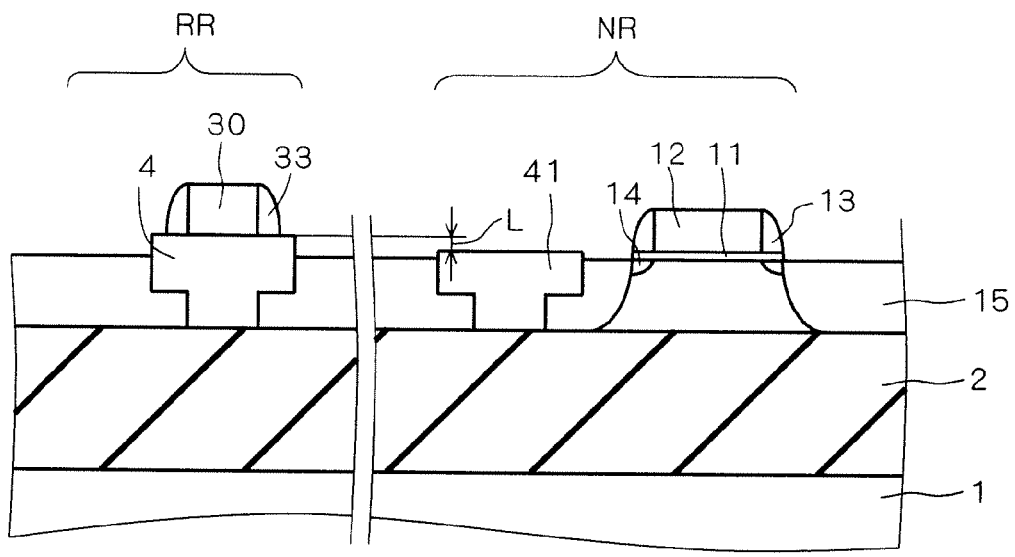
FIG. 30 explains a difference in thickness between respective isolation films in the resistor region and the element region of the semiconductor device according to the preferred embodiment of the present invention.

FIG. 30 is a sectional view of the NMOS region NR and the resistor region RR provided after the N-channel transistor 10 is formed, according to a third modification.

As illustrated in FIG. 30, the thickness of the trench isolation film 4 in the resistor region RR (a first trench isolation film) is larger than that of a trench isolation film 41 in the NMOS region NR (a second trench isolation film) by a thickness L. As a result of such structure, increase in parasitic capacitance of each of the resistive elements 30 can be prevented.

The thickness L corresponds to a difference in total etch amount resulted from the steps from the step of removing the pad oxide film PDX1 to the step of forming the sidewall insulating film, between the respective trench isolation films in the resistor region and in the element region.

Additionally, also in other situations than described above, for example, in a situation where plural transistors including respective gate insulating films with different thicknesses, such as transistors used as input/output parts, a power supply voltage of which is 3.3V, are provided, removal and formation of a silicon oxide film is repeated (dual oxidation) in the element region. Even in such situation, by protecting the resistor region RR from etching with the use of a resist mask, it is possible to suppress reduction of the thickness of each of the trench isolation films in the resistor region, to thereby prevent increase in parasitic capacitance.

G. Fourth Modification

According to the above-described preferred embodiment, the trench isolation films 4 each with the hybrid-trench isolation structure are provided at intervals with portions of the SOI layer 3 interposed therebetween in the surface of the SOI layer in the resistor region RR. This structure allows prevention of occurrence of dishing in a CMP process for forming the trench isolation films 4. However, location of the SOI layer 3 is not limited to a space between two adjacent ones of the trench isolation films 4, in other words, between two adjacent ones of the resistive elements 30. The SOI layer 3 may be also provided outwardly from end portions of each of the resistive elements 30, which end portions are opposite to each other across a longer length of each of the resistive elements 30, as illustrated in FIG. 31, for example.

Figure 31:
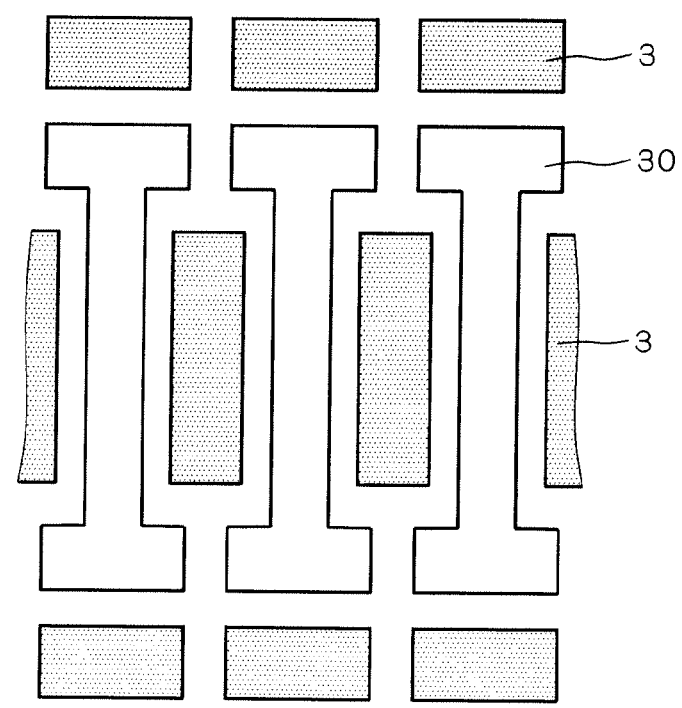
FIG. 31 is a plan view for explaining arrangement of resistive elements and an SOI layer of a semiconductor device according to a fourth modification of the preferred embodiment of the present invention.

The location of the SOI layer 3 illustrated in FIG. 31 further suppresses occurrence of dishing in the trench isolation films 4 in the CMP process. As a result, uniformity in thickness of the trench isolation films 4 is further improved.

H. Fifth Modification

According to the above-described preferred embodiment and the modifications thereof, the resistive elements 30 are provided on the trench isolation films 4 each with the hybrid-trench isolation structure or the trench isolation films 4B each with the full-trench isolation structure which are formed in the surface of the SOI layer 3 in the resistor region RR. Alternatively, resistive elements may be provided on the SOI layer 3. A structure in which resistive elements are provided on the SOI layer 3 according to a fifth modification will be described below with reference to FIG. 32.

FIG. 32 is a sectional view of the NMOS region NR and the resistor region RR provided after the N-channel MOS transistor 10 are formed according to the fifth modification.

As illustrated in FIG. 32, resistive elements 30A are provided via insulating films 35 on portions of the SOI layer 3 each of which is interposed between two adjacent ones of the trench isolation films 4 in the resistor region RR. Further, the sidewall insulating films 33 are provided to cover side faces of the insulating films 35 and the resistive elements 30.

Also in the foregoing structure according to the fifth modification, the resistive elements 30A can be located under the spiral inductor SI.

Further, like the above-described preferred embodiment, the SOI layer 3 is protected so that implantation of impurities into the SOI layer 3 is prevented in the resistor region RR during implantation of impurities into the element region.

Figure 16:
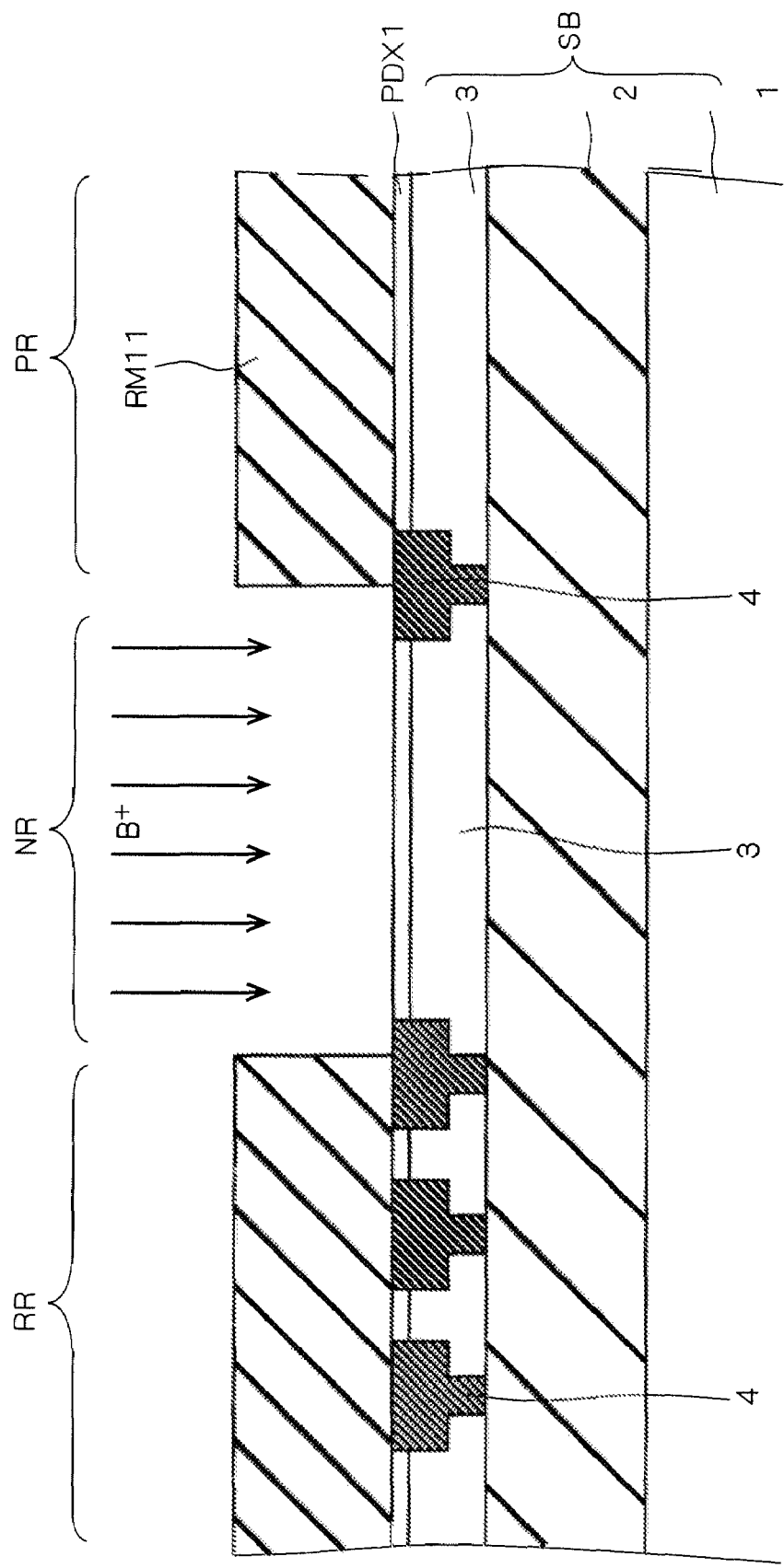
FIGS. 16 through 25 are sectional views for explaining a method of manufacturing the resistor region and an element region of the semiconductor device according to the preferred embodiment of the present invention.

Each of the insulating films 35 can be obtained by leaving a portion of the pad oxide film PDX1 illustrated in FIG. 16 which is located in the resistor region RR un-removed and forming the silicon oxide film OX11 on the un-removed portion of the pad oxide film PDX in the step illustrated in FIG. 19. Accordingly, a thickness of each of the insulating films 35 can be made equal to a total thickness of the pad oxide film PDX1 and the silicon oxide film OX11. This allows reduction in parasitic capacitance of each of the resistive elements 30A formed on the insulating films 35.

Additionally, also in other situations than described above, for example, in a situation where plural transistors including respective gate insulating films with different thicknesses, such as transistors used as input/output parts, a power supply voltage of which is 3.3V, are provided, the gate insulating films with different thicknesses are formed in the element region. To this end, removal and formation of a silicon oxide film is repeated (dual oxidation) in the element region. In such situation, once a silicon oxide film is formed on the SOI layer 3, a portion of the silicon oxide film located in the resistor region RR is not removed by covering the resistor region RR with a resist mask or the like during removal of the other portion of the silicon oxide film in the element region. As a result, a thick silicon oxide film is provided on the SOI layer 3 in the resistor region RR. Thus, each of the resistive elements 30A formed on the thick silicon oxide film can have a considerably reduced parasitic capacitance.

Moreover, though each of the trench isolation films described above includes a silicon oxide film, each of the trench isolation films may alternatively include a silicon nitride film.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
an SOI substrate including a substrate serving as a base, a buried oxide film provided on said substrate, and an SOI layer provided on said buried oxide film;
plural first isolation films provided in a main surface of said SOI layer in a first region defined on said SOI substrate, with a portion of said SOI layer interposed therebetween; and
plural resistive elements provided on said plural first isolation films in said first region, respectively;
wherein at least a portion of each of said plural first isolation films passes through said SOI layer and reaches said buried oxide film to include a full-trench isolation structure;
wherein each of said plural first isolation films includes a hybrid-trench isolation structure in which a central portion includes said full-trench isolation structure and each of opposite side portions is located on said SOI layer to include a partial-trench isolation structure, in section;
wherein said SOI layer is an impurity layer of a first conductivity type, further comprising:
a MOS transistor provided in an element forming region of said SOI layer; and
a partial isolation region provided in said SOI layer;
wherein said partial isolation region includes partial isolation films formed in an upper layer of said SOI layer and a semiconductor region located under partial isolation films of the first conductivity type which is a part of said SOI layer in a lower layer,
said MOS transistor includes second conductivity type source/drain layers each selectively formed in said SOI layer,
a gate electrode provided over a region of said SOI layer positioned between said source/drain layers, with a gate oxide film lying between said electrode and said region, and
a channel region of the first conductivity type provided on an upper layer of said SOI layer between said source/drain layers,
said channel region is electrically connected to a body-potential fixing region of the first conductivity type, with said semiconductor region located under partial isolation films lying between said channel region and said body-potential region.

2. A semiconductor device comprising:
an SOI substrate including a substrate serving as a base, a buried oxide film provided on said substrate, and an SOI layer provided on said buried oxide film;
plural first isolation films provided in a main surface of said SOI layer in a first region defined on said SOI substrate, with a portion of said SOI layer interposed therebetween;
plural resistive elements provided on said plural first isolation films in said first region, respectively; and
a second isolation film provided in said main surface of said SOI layer in a second region where plural semiconductor elements are to be provided;
wherein at least a portion of each of said plural first isolation films passes through said SOI layer and reaches said buried oxide film to include a full-trench isolation structure;
wherein a thickness of each of said plural first isolation films is larger than that of said second isolation film;
wherein said SOI layer is an impurity layer of a first conductivity type, further comprising:
a MOS transistor provided in an element forming region of said SOI layer; and
a partial isolation region provided in said SOI layer;
wherein said partial isolation region includes partial isolation films formed in an upper layer of said SOI layer and a semiconductor region located under partial isolation films of the first conductivity type which is a part of said SOI layer in a lower layer,
said MOS transistor includes second conductivity type source/drain layers each selectively formed in said SOI layer,
a gate electrode provided over a region of said SOI layer positioned between said source/drain layers, with a gate oxide film lying between said electrode and said region, and
a channel region of the first conductivity type provided on an upper layer of said SOI layer between said source/drain layers,
said channel region is electrically connected to a body-potential fixing region of the first conductivity type, with said semiconductor region located under partial isolation films lying between said channel region and said body-potential region.

3. A semiconductor device comprising:
an SOI substrate including a substrate serving as a base, a buried oxide film provided on said substrate, and an SOI layer provided on said buried oxide film;
plural first isolation films provided in a main surface of said SOI layer in a first region defined on said SOI substrate, with a portion of said SOI layer interposed therebetween; and
plural resistive elements provided on said plural first isolation films in said first region, respectively;
wherein at least a portion of each of said plural first isolation films passes through said SOI layer and reaches said buried oxide film to include a full-trench isolation structure;
wherein each of said plural first isolation films is elongated and extends in a first direction in plan view,
said plural first isolation films are parallel arranged along a second direction perpendicular to said first direction, and
said SOI layer is provided at least between said plural first isolation films in said first region;
wherein said SOI layer is an impurity layer of a first conductivity type, further comprising:
a MOS transistor provided in an element forming region of said SOI layer; and
a partial isolation region provided in said SOI layer;
wherein said partial isolation region includes partial isolation films formed in an upper layer of said SOI layer and a semiconductor region located under partial isolation films of the first conductivity type which is a part of said SOI layer in a lower layer,
said MOS transistor includes second conductivity type source/drain layers each selectively formed in said SOI layer,
a gate electrode provided over a region of said SOI layer positioned between said source/drain layers, with a gate oxide film lying between said electrode and said region, and
a channel region of the first conductivity type provided on an upper layer of said SOI layer between said source/drain layers,
said channel region is electrically connected to a body-potential fixing region of the first conductivity type, with said semiconductor region located under partial isolation films lying between said channel region and said body-potential region.

4. The semiconductor device according to claim 3, wherein said SOI layer is also provided outwardly from end portions of each of said plural first isolation films in said first region, said end portions being opposite to each other in said first direction.

5. A semiconductor device comprising:
an SOI substrate including a substrate serving as a base, a buried oxide film provided on said substrate, and an SOI layer provided on said buried oxide film;
plural first isolation films provided in a main surface of said SOI layer in a first region defined on said SOI substrate, with a portion of said SOI layer interposed therebetween; and
plural resistive elements provided on said plural first isolation films in said first region, respectively;
wherein at least a portion of each of said plural first isolation films passes through said SOI layer and reaches said buried oxide film to include a full-trench isolation structure;
wherein said plural resistive elements include polysilicon;
wherein said SOI layer is an impurity layer of a first conductivity type, further comprising:
a MOS transistor provided in an element forming region of said SOI layer; and
a partial isolation region provided in said SOI layer;
wherein said partial isolation region includes partial isolation films formed in an upper layer of said SOI layer and a semiconductor region located under partial isolation films of the first conductivity type which is a part of said SOI layer in a lower layer,
said MOS transistor includes second conductivity type source/drain layers each selectively formed in said SOI layer,
a gate electrode provided over a region of said SOI layer positioned between said source/drain layers, with a gate oxide film lying between said electrode and said region, and
a channel region of the first conductivity type provided on an upper layer of said SOI layer between said source/drain layers,
said channel region is electrically connected to a body-potential fixing region of the first conductivity type, with said semiconductor region located under partial isolation films lying between said channel region and said body-potential region.

6. A semiconductor device comprising:
an SOI substrate including a substrate serving as a base, a buried oxide film provided on said substrate, and an SOI layer provided on said buried oxide film;
plural first isolation films provided in a main surface of said SOI layer in a first region defined on said SOI substrate, with portions of said SOI layer interposed therebetween; and
plural resistive elements provided via insulating films on said portions of said SOI layer interposed between said plural first isolation films, respectively;
wherein at least a portion of each of said plural first isolation films passes through said SOI layer and reaches said buried oxide film to include a full-trench isolation structure;
wherein each of said plural first isolation films includes a hybrid-trench isolation structure in which a central portion includes said full-trench isolation structure and each of opposite side portions is located on said SOI layer to include a partial-trench isolation structure, in section;
wherein said SOI layer is an impurity layer of a first conductivity type, further comprising:
a MOS transistor provided in an element forming region of said SOI layer; and
a partial isolation region provided in said SOI layer;
wherein said partial isolation region includes partial isolation films formed in an upper layer of said SOI layer and a semiconductor region located under partial isolation films of the first conductivity type which is a part of said SOI layer in a lower layer,
said MOS transistor includes second conductivity type source/drain layers each selectively formed in said SOI layer,
a gate electrode provided over a region of said SOI layer positioned between said source/drain layers, with a gate oxide film lying between said electrode and said region, and a channel region of the first conductivity type provided on an upper layer of said SOI layer between said source/drain layers, said channel region is electrically connected to a body-potential fixing region of the first conductivity type, with said semiconductor region located under partial isolation films lying between said channel region and said body-potential region.

7. A semiconductor device comprising:

an SOI substrate including a substrate serving as a base, a buried oxide film provided on said substrate, and an SOI layer provided on said buried oxide film;

plural first isolation films provided in a main surface of said SOI layer in a first region defined on said SOI substrate, with portions of said SOI layer interposed therebetween; and plural resistive elements provided via insulating films on said portions of said SOI layer interposed between said plural first isolation films, respectively;

wherein at least a portion of each of said plural first isolation films passes through said SOI layer and reaches said buried oxide film to include a full-trench isolation structure;

wherein said SOI layer includes impurities with a concentration which allows said SOI layer to be fully depleted in said first region; and a second isolation film provided in said main surface of said SOI layer in a second region where plural semiconductor elements are to be provided;

wherein a thickness of each of said plural first isolation films is larger than that of said second isolation film;

wherein said SOI layer is an impurity layer of a first conductivity type, further comprising:

a MOS transistor provided in an element forming region of said SOI layer; and a partial isolation region provided in said SOI layer;

wherein said partial isolation region includes partial isolation films formed in an upper layer of said SOI layer and a semiconductor region located under partial isolation films of the first conductivity type which is a part of said SOI layer in a lower layer, said MOS transistor includes second conductivity type source/drain layers each selectively formed in said SOI layer, a gate electrode provided over a region of said SOI layer positioned between said source/drain layers, with a gate oxide film lying between said electrode and said region, and a channel region of the first conductivity type provided on an upper layer of said SOI layer between said source/drain layers, said channel region is electrically connected to a body-potential fixing region of the first conductivity type, with said semiconductor region located under partial isolation films lying between said channel region and said body-potential region.

8. A semiconductor device comprising:

an SOI substrate including a substrate serving as a base, a buried oxide film provided on said substrate, and an SOI layer provided on said buried oxide film;

plural first isolation films provided in a main surface of said SOI layer in a first region defined on said SOI substrate, with portions of said SOI layer interposed therebetween; and plural resistive elements provided via insulating films on said portions of said SOI layer interposed between said plural first isolation films, respectively;

wherein at least a portion of each of said plural first isolation films passes through said SOI layer and reaches said buried oxide film to include a full-trench isolation structure;

wherein each of said plural first isolation films is elongated and extends in a first direction in plan view, said plural first isolation films are parallel arranged along a second direction perpendicular to said first direction, and said SOI layer is provided at least between said plural first isolation films in said first region;

wherein said SOI layer is an impurity layer of a first conductivity type, further comprising:

a MOS transistor provided in an element forming region of said SOI layer; and a partial isolation region provided in said SOI layer;

wherein said partial isolation region includes partial isolation films formed in an upper layer of said SOI layer and a semiconductor region located under partial isolation films of the first conductivity type which is a part of said SOI layer in a lower layer, said MOS transistor includes second conductivity type source/drain layers each selectively formed in said SOI layer, a gate electrode provided over a region of said SOI layer positioned between said source/drain layers, with a gate oxide film lying between said electrode and said region, and a channel region of the first conductivity type provided on an upper layer of said SOI layer between said source/drain layers, said channel region is electrically connected to a body-potential fixing region of the first conductivity type, with said semiconductor region located under partial isolation films lying between said channel region and said body-potential region.

9. The semiconductor device according to claim 8, wherein said SOI layer is also provided outwardly from end portions of each of said plural first isolation films in said first region, said end portions being opposite to each other in said first direction.

10. A semiconductor device comprising:

an SOI substrate including a substrate serving as a base, a buried oxide film provided on said substrate, and an SOI layer provided on said buried oxide film;

plural first isolation films provided in a main surface of said SOI layer in a first region defined on said SOI substrate, with portions of said SOI layer interposed therebetween; and plural resistive elements provided via insulating films on said portions of said SOI layer interposed between said plural first isolation films, respectively;

wherein at least a portion of each of said plural first isolation films passes through said SOI layer and reaches said buried oxide film to include a full-trench isolation structure;

wherein said plural resistive elements include polysilicon;

wherein said SOI layer is an impurity layer of a first conductivity type, further comprising:

a MOS transistor provided in an element forming region of said SOI layer; and a partial isolation region provided in said SOI layer;

wherein said partial isolation region includes partial isolation films formed in an upper layer of said SOI layer and a semiconductor region located under partial isolation films of the first conductivity type which is a part of said SOI layer in a lower layer, said MOS transistor includes second conductivity type source/drain layers each selectively formed in said SOI layer, a gate electrode provided over a region of said SOI layer positioned between said source/drain layers, with a gate oxide film lying between said electrode and said region, and a channel region of the first conductivity type provided on an upper layer of said SOI layer between said source/drain layers, said channel region is electrically connected to a body-potential fixing region of the first conductivity type, with said semiconductor region located under partial isolation films lying between said channel region and said body-potential region.

* * * * *